United States Patent
Sato et al.

(10) Patent No.: US 11,329,183 B2
(45) Date of Patent: May 10, 2022

(54) PHOTO DETECTION ELEMENT, OPTICAL SENSOR, AND METHOD OF MANUFACTURING PHOTO DETECTION ELEMENT

(71) Applicant: FUJITSU LIMITED, Kawasaki (JP)

(72) Inventors: Shintaro Sato, Atsugi (JP); Hironori Nishino, Isehara (JP); Daiyu Kondo, Atsugi (JP); Kenjiro Hayashi, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 48 days.

(21) Appl. No.: 16/601,654

(22) Filed: Oct. 15, 2019

(65) Prior Publication Data
US 2020/0152817 A1    May 14, 2020

(30) Foreign Application Priority Data
Nov. 8, 2018  (JP) .............................. JP2018-210630

(51) Int. Cl.
| | |
|---|---|
| *H01L 31/09* | (2006.01) |
| *H01L 31/032* | (2006.01) |
| *H01L 31/0304* | (2006.01) |
| *H01L 31/0224* | (2006.01) |

(52) U.S. Cl.
CPC ...... *H01L 31/09* (2013.01); *H01L 31/022408* (2013.01); *H01L 31/0324* (2013.01); *H01L 31/03044* (2013.01)

(58) Field of Classification Search
CPC ................. H01L 31/09; H01L 31/0324; H01L 31/03044; H01L 31/022408; H01L 31/0224; H01L 31/028; H01L 31/0352
See application file for complete search history.

(56) References Cited

U.S. PATENT DOCUMENTS

| | | | | |
|---|---|---|---|---|
| 10,830,640 | B2 * | 11/2020 | Imaizumi | H01Q 1/368 |
| 2013/0193404 | A1 * | 8/2013 | Koppens | H01L 31/0547 257/9 |
| 2013/0309776 | A1 * | 11/2013 | Drndic | G01N 33/48721 436/94 |
| 2014/0008611 | A1 | 1/2014 | Geim et al. | |
| 2016/0104852 | A1 * | 4/2016 | Sato | H01L 51/0032 257/27 |

(Continued)

FOREIGN PATENT DOCUMENTS

| | | |
|---|---|---|
| JP | 2014-522321 A | 9/2014 |
| JP | 2018-519664 A | 7/2018 |

OTHER PUBLICATIONS

Cai, Xinghan et al., "Sensitive room-temperature terahertz detection via the photothermoelectric effect in graphene", Nature Nanotechnology, Sep. 7, 2014, vol. 9, pp. 814-819.

*Primary Examiner* — Marcus H Taningco
(74) *Attorney, Agent, or Firm* — Fujitsu Patent Center

(57) ABSTRACT

A photo detection element includes: a substrate; a light-receiving layer formed over the substrate, the light-receiving layer including graphene layers and spacer layers that are alternately stacked, light passing through each of the spacer layers, the spacer layers being made of insulating material; a first electrode that is in contact with the light-receiving layer; and a second electrode that is in contact with the light-receiving layer, a material of the second electrode being different from a material of the first electrode.

17 Claims, 23 Drawing Sheets

(56) References Cited

U.S. PATENT DOCUMENTS

| | | | |
|---|---|---|---|
| 2017/0088944 A1* | 3/2017 | Sultana | C01B 32/194 |
| 2018/0138231 A1* | 5/2018 | Kim | H01L 27/1462 |
| 2018/0158913 A1 | 6/2018 | Withers et al. | |
| 2020/0152679 A1* | 5/2020 | Sato | H01L 31/028 |
| 2020/0393296 A1* | 12/2020 | Ju | G01J 1/44 |
| 2020/0395499 A1* | 12/2020 | Ogawa | H01L 31/0288 |

* cited by examiner

PHOTO DETECTION ELEMENT, OPTICAL SENSOR, AND METHOD OF MANUFACTURING PHOTO DETECTION ELEMENT

CROSS-REFERENCE TO RELATED APPLICATION

This application is based upon and claims the benefit of priority of the prior Japanese Patent Application No. 2018-210630 filed on Nov. 8, 2018, the entire contents of which are incorporated herein by reference.

FIELD

A certain aspect of the embodiments is related to a photo detection element, an optical sensor, and a method of manufacturing a photo detection element.

BACKGROUND

Photo detection elements are roughly classified into two type based on their principles. A first photo detection element is an element in which a semiconductor layer is used for a light-receiving layer. In particular, the photo detection element using a semiconductor layer having a small band gap has sensitivity in the infrared region, has high sensitivity, and has high responsivity. However, in this type of photo detection element, it is necessary to cool the semiconductor layer to reduce noise.

A second photo detection element is an element that detects a change in the temperature of a thin film irradiated with a light, and is also referred to as a bolometer or a thermal type element. This type of photo detection element detects a light based on a change in the temperature of the thin film. Thus, it is not necessary to cool the thin film, and the photo detection element can operate at room temperature. However, the sensitivity and the response speed of this type of photo detection element are inferior to those of the photo detection element using the semiconductor layer described above.

A photo detection element that uses the photo-thermoelectric effect of graphene to detect a light is also reported. This photo detection element can detect lights in the near infrared region and the terahertz region at a response speed of 1 nanosecond or less under room temperature. However, the photo detection element using graphene has a sensitivity of only approximately 10 V/W even in the terahertz region where the sensitivity is the highest.

SUMMARY

According to an aspect of the embodiments, there is provided a photo detection element includes: a substrate; a light-receiving layer formed over the substrate, the light-receiving layer including graphene layers and spacer layers that are alternately stacked, light passing through each of the spacer layers, the spacer layers being made of insulating material; a first electrode that is in contact with the light-receiving layer, and a second electrode that is in contact with the light-receiving layer, a material of the second electrode being different from a material of the first electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
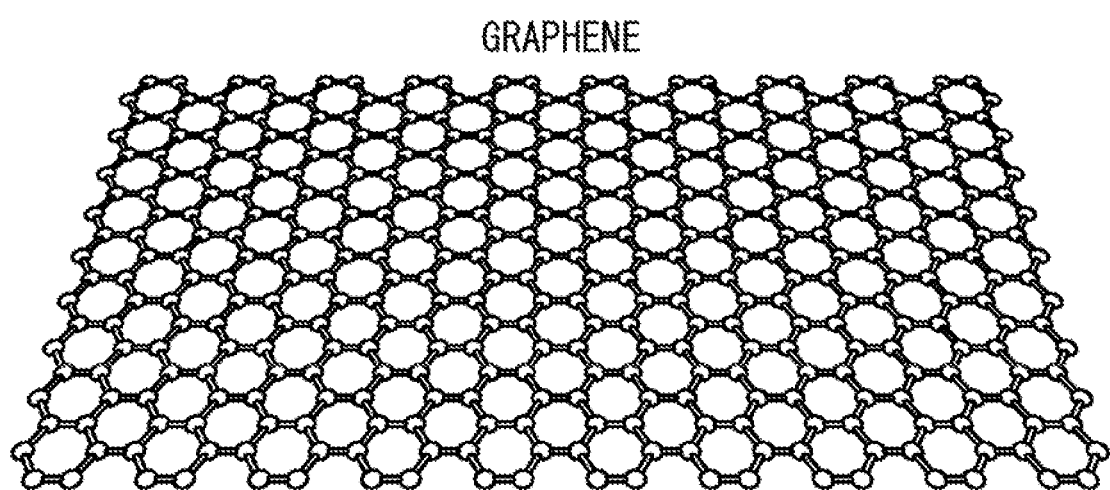
FIG. 1 is a perspective view schematically illustrating the molecular structure of graphene used in a photo detection element.

Research conducted by the inventors will be described. FIG. 1 is a perspective view schematically illustrating the molecular structure of graphene used in a photo detection element. As illustrated in FIG. 1, graphene is a substance composed of a monoatomic layer in which carbon atoms are positioned in vertices of hexagonal cells.

As described above, the photo detection element using the photo-thermoelectric effect of graphene to detect a light has a low sensitivity such as approximately 10 V/W. This is considered because the light absorptivity of graphene is low. The light absorptivity of graphene is only approximately 2.3% regardless of wavelengths, and the remaining 97% or more of the light is discarded. Furthermore, since this photo detection element detects a light only with a single graphene layer, it is impossible to improve the sensitivity. It may be considered that multiple graphene layers are stacked and the photo-thermoelectric effect of graphene of each layer is used to improve the sensitivity. However, when multiple graphene layers are simply stacked, graphite, which has a band structure different from that of graphene, is obtained.

Figure 2A:
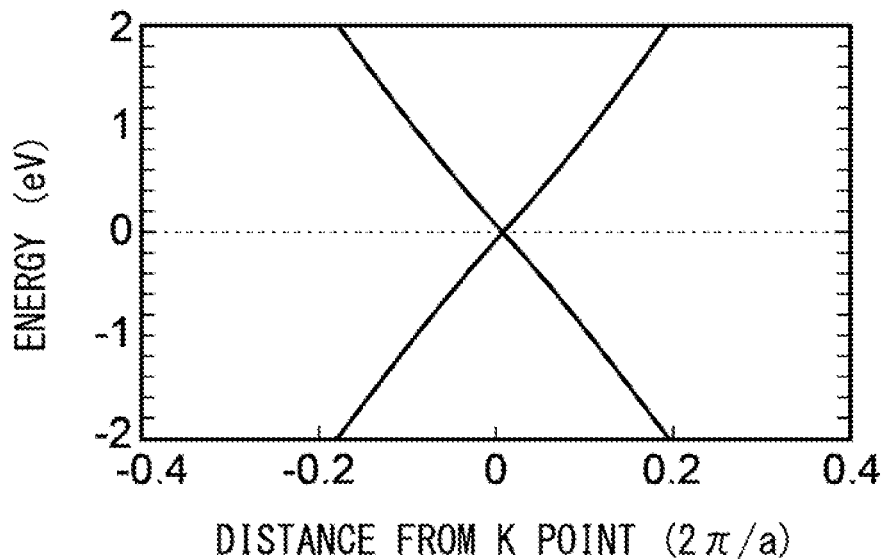
FIG. 2A illustrates the band structure of graphene.
Figure 2B:
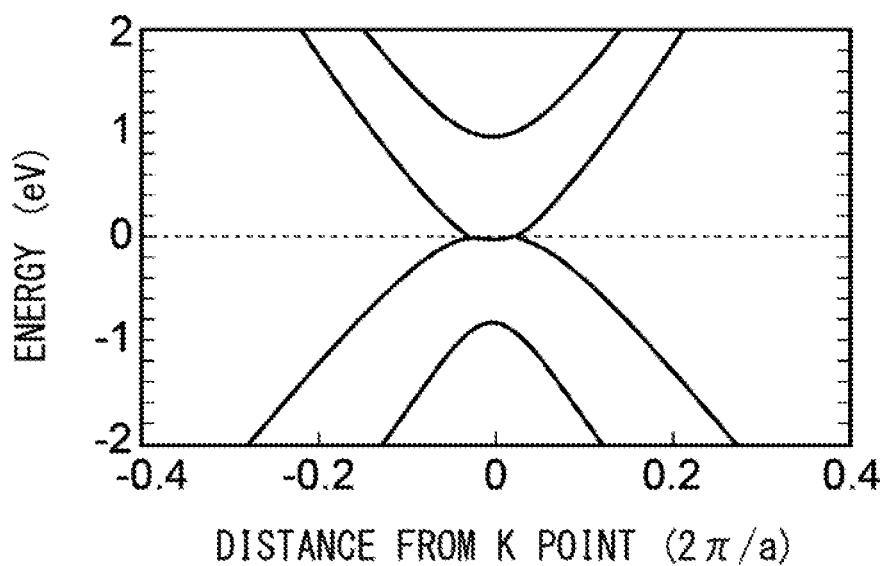
FIG. 2B illustrates the band structure of graphite.

FIG. 2A illustrates the band structure of graphene, and FIG. 2B illustrates the band structure of graphite. In FIG. 2A and FIG. 2B, the horizontal axis represents a distance from the K point in the reciprocal lattice space when "a" represents the lattice length of graphene (0.249 nm). The vertical axis represents the energy of electron (eV).

As illustrated in FIG. 2A the band curve of graphene is linear around the K point of the reciprocal lattice space. This leads to the characteristics of graphene that the light absorptivity does not depend on the wavelength and the electron mobility around the K point is high.

On the other hand, as illustrated in FIG. 2B, for graphite, the slope of the band curve is 0 around the K point. This results in decrease in the electron mobility around the K point. In addition, since the band curve is not linear, the light absorptivity of graphite changes according to the wavelength of a light.

Thus, to achieve high sensitivity of the photo detection element while taking advantage of the characteristics of graphene such as high electron mobility and wavelength-independent light absorptivity, graphene layers are preferably stacked while the graphene layers are inhibited from forming graphite. Hereinafter, embodiments will be described.

First Embodiment

A photo detection element of a first embodiment will be described by following the manufacturing process thereof. The photo detection element is an element that uses the photo-thermoelectric effect of graphene to detect a light, and is manufactured as follows. FIG. 3A through FIG. 9B are cross-sectional views of the photo detection element in accordance with the first embodiment in the process of production.

Figure 3A:
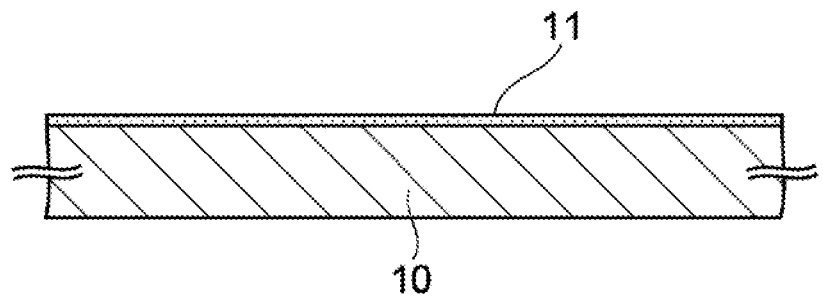
FIG. 3A through FIG. 3C are cross-sectional views (No. 1) of a photo detection element in accordance with a first embodiment in the process of production.

First, as illustrated in FIG. 3A, a copper foil is prepared as a catalytic metal layer 10, and the catalytic metal layer 10 is placed in a thermal chemical vapor deposition (CVD) furnace (not illustrated). Then, a mixed gas of methane, hydrogen, and argon is supplied to the furnace while the catalytic metal layer 10 is heated to approximately 1000° C. This state is maintained for approximately 30 minutes. Thereby, a graphene monoatomic layer 11 grows on the catalytic metal layer 10 because of the catalytic action of the catalytic metal layer 10.

Figure 3B:
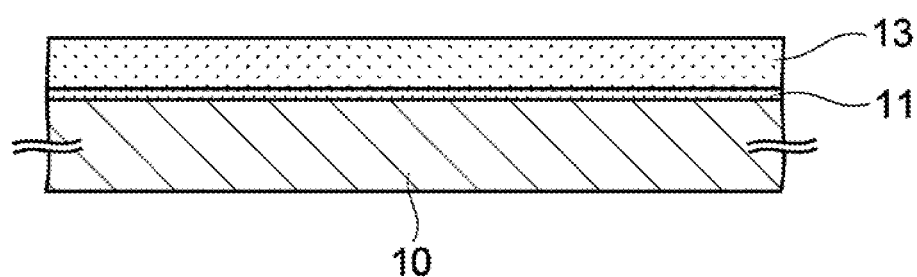

Then, as illustrated in FIG. 3B, a polymer such as polymethyl methacrylate (PMMA) is applied to a thickness of approximately 0.1 μm to 100 μm on the graphene layer 11 by spin coating. The polymer coating film is referred to as a first supporting layer 13. Instead of a polymer, a resist coating film may be formed as the first supporting layer 13.

Figure 3C:
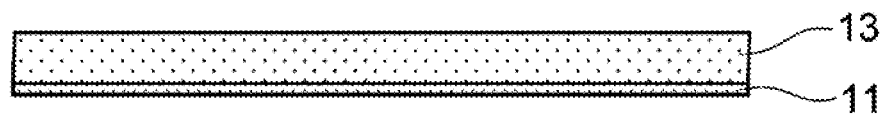

Thereafter, the first supporting layer 13 is heated to remove the solvent component in the film. The heating temperature at this time is, for example, a room temperature to approximately 200° C. depending on the material of the first supporting layer 13. Then, as illustrated in FIG. 3C, for example, the catalytic metal layer 10 is dissolved and removed with a ferric chloride iron solution to obtain the structure in which the graphene layer 11 is formed on the surface of the first supporting layer 13. Next, the step illustrated in FIG. 4A will be described.

A sapphire substrate 15 is prepared separately from the steps of FIG. 3A through FIG. 3C described above. A copper layer is formed, as a catalytic metal layer 16, to a thickness of approximately 50 nm to 5000 nm, for example, approximately 1000 nm on the sapphire substrate 15 by sputtering.

Figure 4A:
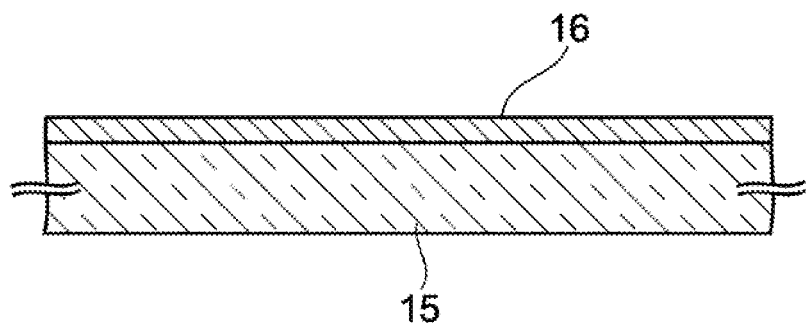
FIG. 4A through FIG. 4C are cross-sectional views (No. 2) of the photo detection element in accordance with the first embodiment in the process of production.
Figure 4B:
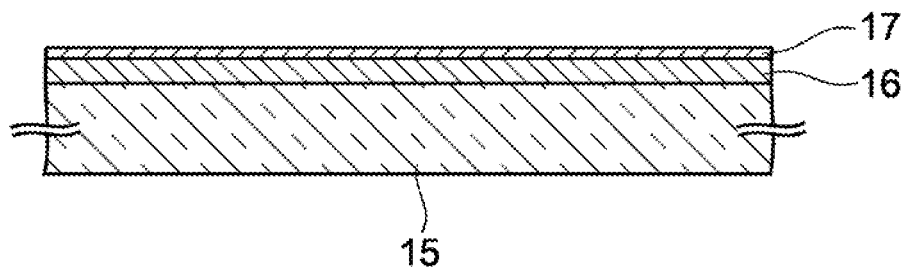

Then, as illustrated in FIG. 4B, the sapphire substrate 15 is placed in a thermal CVD furnace (not illustrated), and a mixed gas of ammonia, diborane, hydrogen, and argon is supplied to the furnace while the substrate temperature is maintained at approximately 1050° C. Then, this state is maintained for approximately 30 minutes to cause hexagonal boron nitride (hBN) to grow, as a spacer layer 17 having an insulation property, on the catalytic metal layer 16 to the thickness of a monoatomic layer because of the catalytic action of the catalytic metal layer 16. Instead of the sapphire substrate 15, a silicon substrate may be used.

Figure 4C:
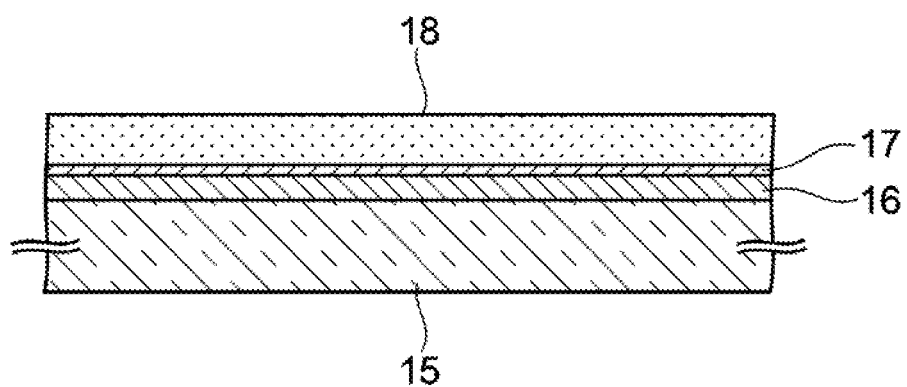

Then, as illustrated in FIG. 4C, a polymer such as PMMA is applied to a thickness of approximately 0.1 μm to 100 μm on the spacer layer 17 by spin coating. The polymer coating film is referred to as a second supporting layer 18. As with the first supporting layer 13, a resist coating film may be formed as the second supporting layer 18. Thereafter, the second supporting layer 18 is heated to a temperature of a room temperature to approximately 200° C. to remove the solvent component in the film.

Figure 5A:
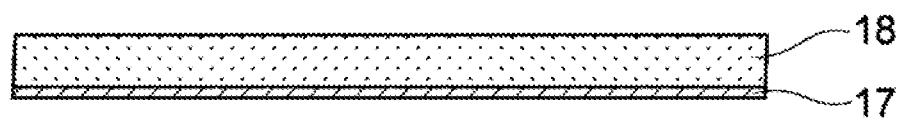
FIG. 5A and FIG. 5B are cross-sectional views (No. 3) of the photo detection element in accordance with the first embodiment in the process of production.

Then, as illustrated in FIG. 5A, the catalytic metal layer 16 is etched and removed from the sides by immersing the sapphire substrate 15 in an etching liquid, and the structure in which the spacer layer 17 is formed on the surface of the second supporting layer 18 is formed. The etching liquid for this step is not particularly limited, but an iron (III) chloride ($FeCl_3$) solution, which does not generate bubbles at the time of etching, is preferably used as the etching liquid.

In this example, the spacer layer 17 is formed on the catalytic metal layer 16, but the spacer layer 17 may be formed on the surface of a catalytic metal foil. In this case, since the spacer layer 17 is formed on both surfaces of the catalytic metal foil, and the spacer layer 17 may disturb wet etching of the catalytic metal foil. Thus, in this case, the spacer layer 17 on one of the surfaces of the catalytic metal foil is preferably mechanically scraped off with a file or the like. The spacer layer 17 may be removed by oxygen plasma or argon plasma. After the second supporting layer 18 is formed on the spacer layer 17 remaining on the other of the surfaces of the catalytic metal foil, the catalytic metal foil is made afloat on an etching liquid with the second supporting layer 18 up to etch the catalytic metal foil from below. Thereby, the same structure as that of FIG. 5A is obtained.

Through the above steps, obtained are the structure in which the graphene layer 11 is formed on the surface of the first supporting layer 13 as illustrated in FIG. 3C and the structure in which the spacer layer 17 is formed on the surface of the second supporting layer 18 as illustrated in FIG. 5A. Thereafter, the graphene layers 11 and the spacer layers 17 are alternately stacked in the following manner.

Figure 5B:
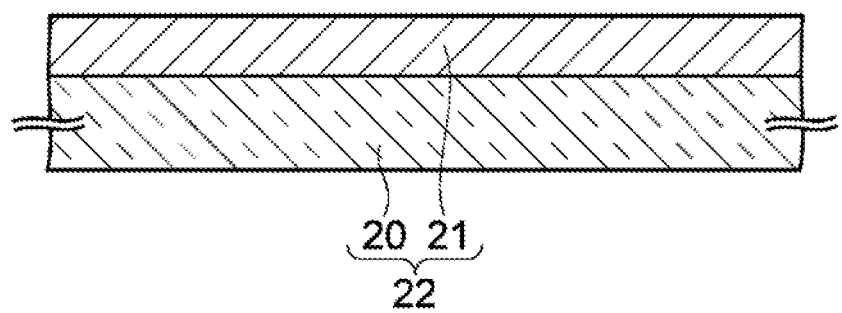
Figure 6A:
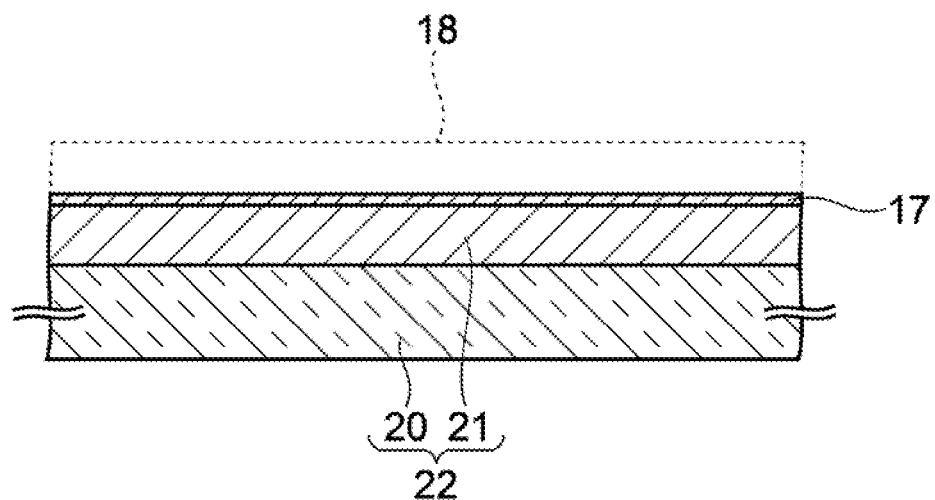
FIG. 6A and FIG. 6B are cross-sectional views (No. 4) of the photo detection element in accordance with the first embodiment in the process of production.

First, a substrate 22 for an element is prepared. The substrate 22 has a structure in which a silicon oxide layer 21 is formed on a silicon wafer 20 as illustrated in FIG. 5B. The silicon oxide layer 21 functions as an insulating layer that electrically insulates elements such as electrodes and the light-receiving layer to be formed later from each other, and is formed to a thickness of approximately 50 nm to 1000 nm. Then, as illustrated in FIG. 6A, the second supporting layer 18 is made to be in close contact with the substrate 22 while the spacer layer 17 is located between the second supporting layer 18 and the substrate 22.

This process causes the spacer layer 17 formed on the second supporting layer 18 to stick to the silicon oxide layer 21 because of van der Waals force, and thereby the spacer layer 17 is transferred to the silicon oxide layer 21.

When the second supporting layer 18 is made to be in close contact with the substrate 22, the substrate 22 may be heated to a temperature of a room temperature to approximately 300° C. This removes water from the boundary face between the spacer layer 17 and the silicon oxide layer 21, and the sticking force between them is thereby enhanced. Thereafter, the second supporting layer 18 is dissolved and removed with an organic solvent such as acetone.

Figure 6B:
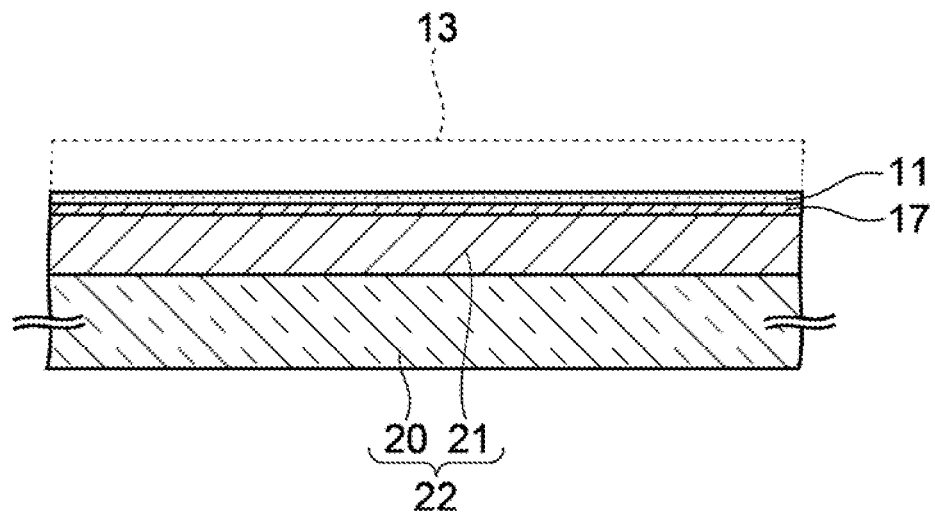

Then, as illustrated in FIG. 6B, the first supporting layer 13 is made to be in close contact with the substrate 22 while the graphene layer 11 is located between the first supporting layer 13 and the substrate 22 to transfer the graphene layer 11 formed on the first supporting layer 13 to the spacer layer 17. The graphene layer 11 and the spacer layer 17 stick to each other because of van der Waals force. Thereafter, the first supporting layer 13 is dissolved and removed with an organic solvent such as acetone.

Figure 7A:
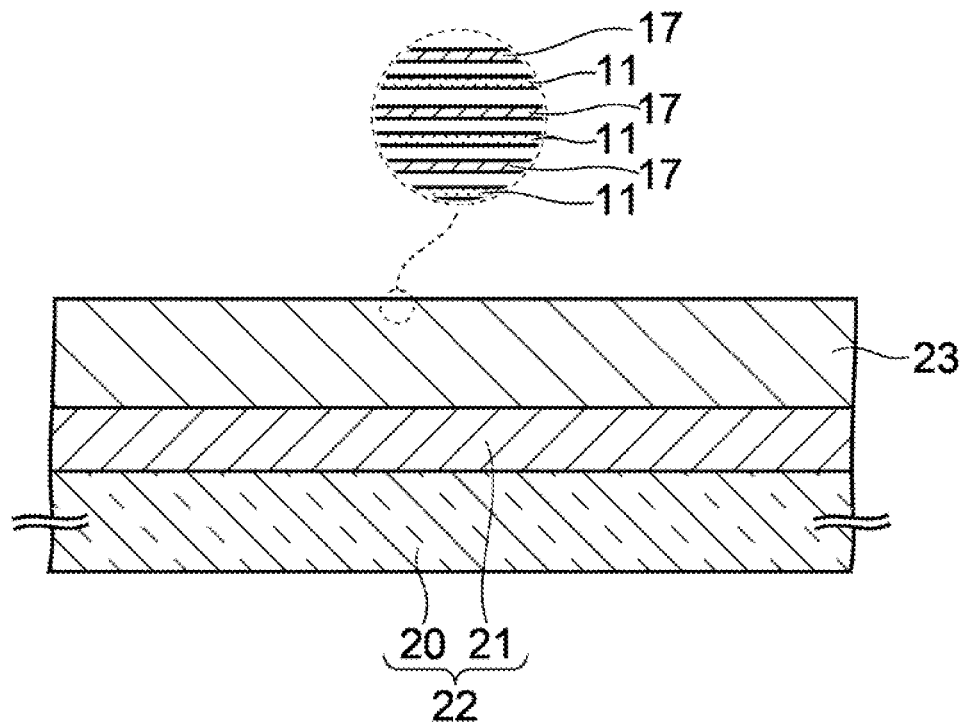
FIG. 7A and FIG. 7B are cross-sectional views (No. 5) of the photo detection element in accordance with the first embodiment in the process of production.

Then, the transfer of the graphene layer 11 and the transfer of the spacer layer 17 are alternately repeated a plurality of times. Thereby, formed is a light-receiving layer 23 in which the graphene layers 11 and the spacer layers 17 are alternately stacked as illustrated in FIG. 7A. In this example, since the spacer layer 17 is transferred to the substrate 22 first as illustrated in FIG. 6A, the lowermost layer of the light-receiving layer 23 is the spacer layer 17. The number of layers that are stacked in the light-receiving layer 23 is not particularly limited. For example, 1 to 500 graphene layers 11, for example, approximately 100 graphene layers 11 are stacked, and 1 to 500 spacer layers 17, for example, approximately 100 spacer layers 17 are stacked.

Figure 7B:
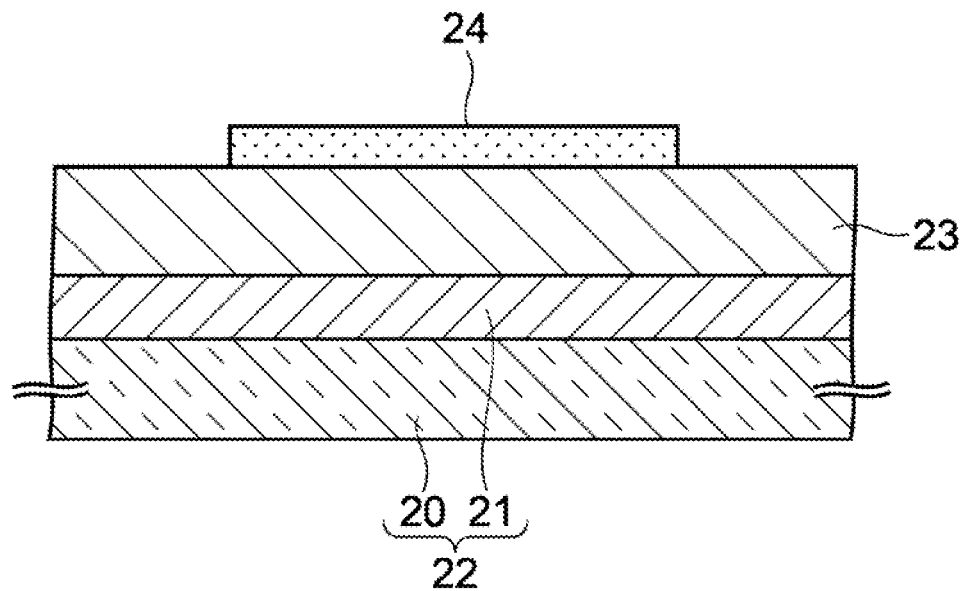
Figure 10:
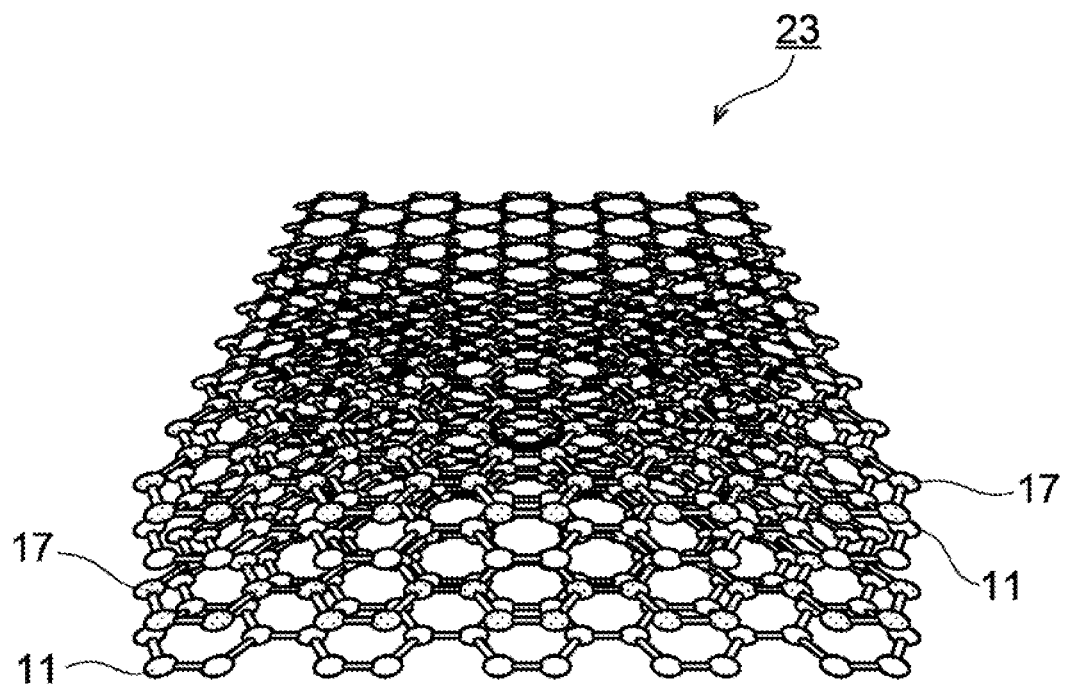
FIG. 10 is a perspective view schematically illustrating a molecular structure of graphene layers and spacer layers in the light-receiving layer in accordance with the first embodiment.

In the light-receiving layer 23, since the spacer layer 17 is interposed between the vertically adjacent graphene layers 11, the graphene layers 11 are inhibited from forming graphite. The graphene layer 11 may be protected from the atmosphere by the spacer layer 17 by making the uppermost layer of the light-receiving layer 23 the spacer layer 17. FIG. 10 is a perspective view schematically illustrating a molecular structure of the graphene layers 11 and the spacer layers 17 in the light-receiving layer 23. As illustrated in FIG. 10, hexagonal boron nitride, which is the material of the spacer layer 17, has hexagonal cells as the graphene layer 11 has. Then, as illustrated in FIG. 7B, photoresist is applied on the light-receiving layer 23, and is then exposed and developed to form an island-shaped mask layer 24.

Figure 8A:
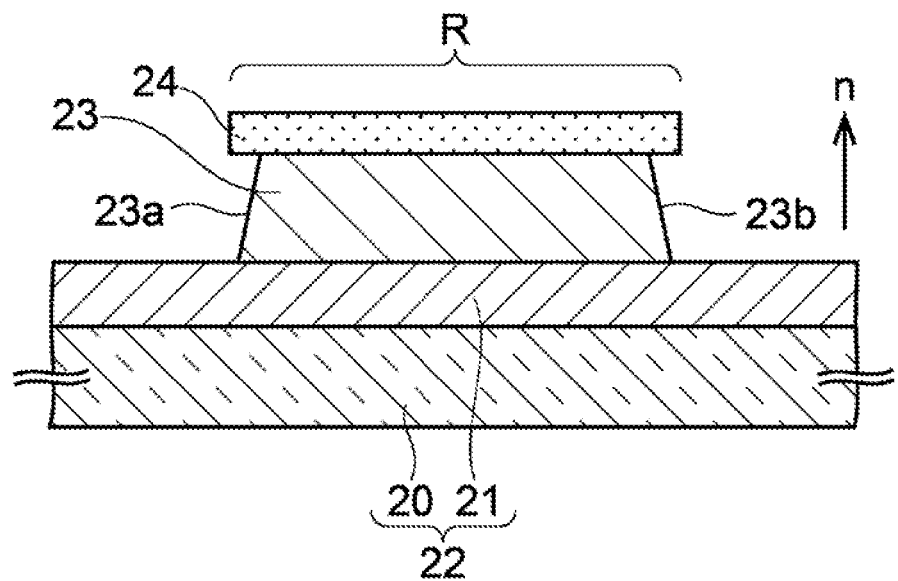
FIG. 8A and FIG. 8B are cross-sectional views (No. 6) of the photo detection element in accordance with the first embodiment in the process of production.
Figure 8B:
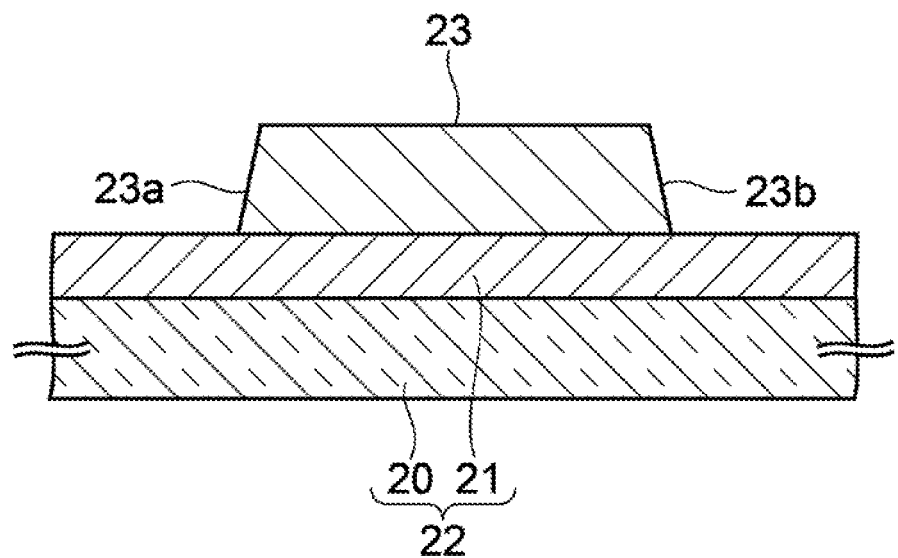

Then, as illustrated in FIG. 8A, a part, which is not covered with the mask layer 24, of the light-receiving layer 23 is isotropically etched by oxygen plasma to leave the light-receiving layer 23 only in a light-receiving region R where a light is received. The isotropic etching described above forms, in the light-receiving layer 23, a first side surface 23a and a second side surface 23b that are inclined with respect to the normal direction n of the substrate 22. Thereafter, as illustrated in FIG. 8B, the mask layer 24 is removed with an organic solvent such as acetone.

Figure 9A:
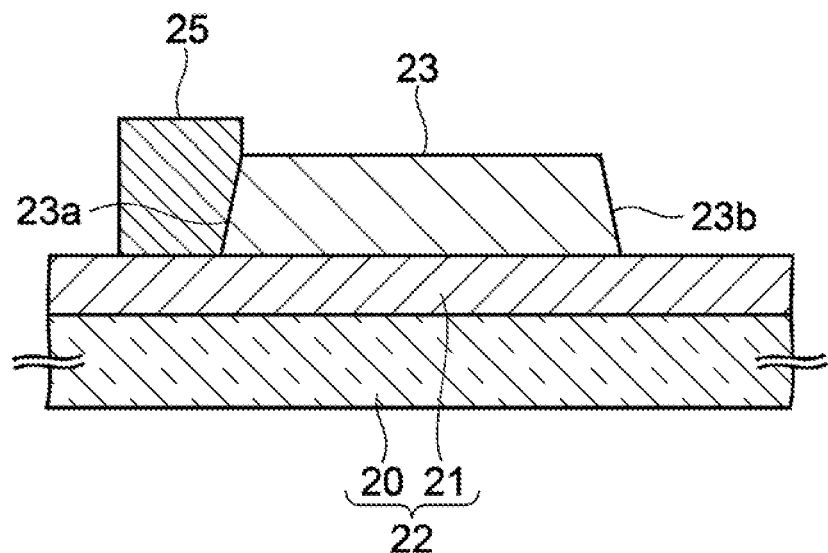
FIG. 9A and FIG. 9B are cross-sectional views (No. 7) of the photo detection element in accordance with the first embodiment in the process of production.

Then, as illustrated in FIG. 9A, a resist layer (not illustrated) having an opening to which the first side surface 23a is exposed is formed, and a titanium layer is then formed across the entire upper surface of the substrate 22 to a thickness of approximately 0.02 μm to 1 μm by evaporation. Thereafter, the resist layer is removed to leave the titanium layer, as a first electrode 25, only on and beside the first side surface 23a and remove the unnecessary titanium layer.

Figure 9B:
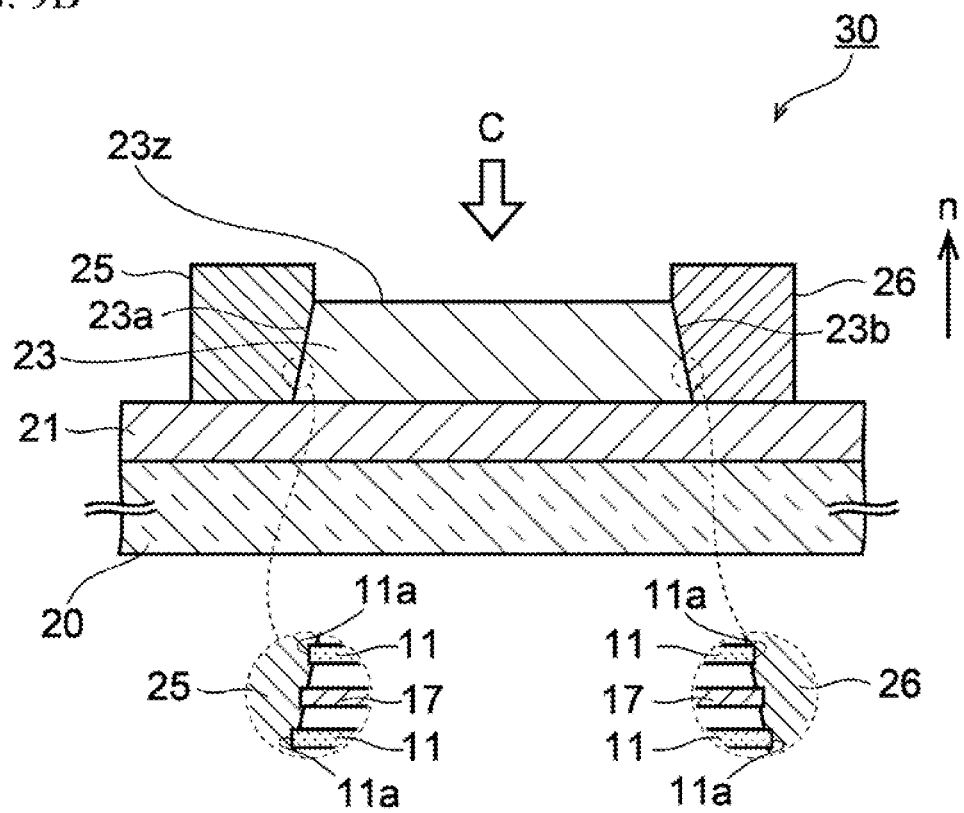

Then, as illustrated in FIG. 9B, after a resist layer (not illustrated) having an opening to which the second side surface 23b is exposed is formed, a metal layer of which the material differs from that of the first electrode 25 is formed across the entire upper surface of the substrate 22 by evaporation. When a titanium layer is formed as the first electrode 25 as described above, a platinum layer is formed, as the metal layer, to a thickness of 0.02 μm to 1 μm. Then, the resist layer is removed to leave the platinum layer, as a second electrode 26, only on and beside the second side surface 23b and remove the unnecessary platinum layer.

The combination of the materials of the first electrode 25 and the second electrode 26 is not limited to the above combination as long as the materials have different Seebeck coefficients. Examples of the material of the first electrode 25 include hafnium, zirconium, and chrome in addition to titanium. Examples of the material of the second electrode 26 include nickel, palladium, and gold in addition to platinum. Among the above-exemplified materials, hafnium, zirconium, titanium, and nickel in particular are more easily graphitized at the ends 11a of the graphene layers 11. Thus, use of these materials reduces the contact resistances between the graphene layers 11 and the electrodes 25 and 26.

The combination of the materials having different Seebeck coefficients may be a combination of metals used in a thermocouple. Examples of such combinations include, alumel-chromel, iron-constantan, copper-constantan, chromel-constantan, nicrosil-nisil, and platinum rhodium-platinum. Through the above process, the fundamental structure of a photo detection element 30 in accordance with the first embodiment is completed.

In the photo detection element 30, the first electrode 25 and the second electrode 26, of which the materials differ from each other as described above, are formed at an interval so as to be in contact with the graphene layers 11 of the light-receiving layer 23.

Figure 11:
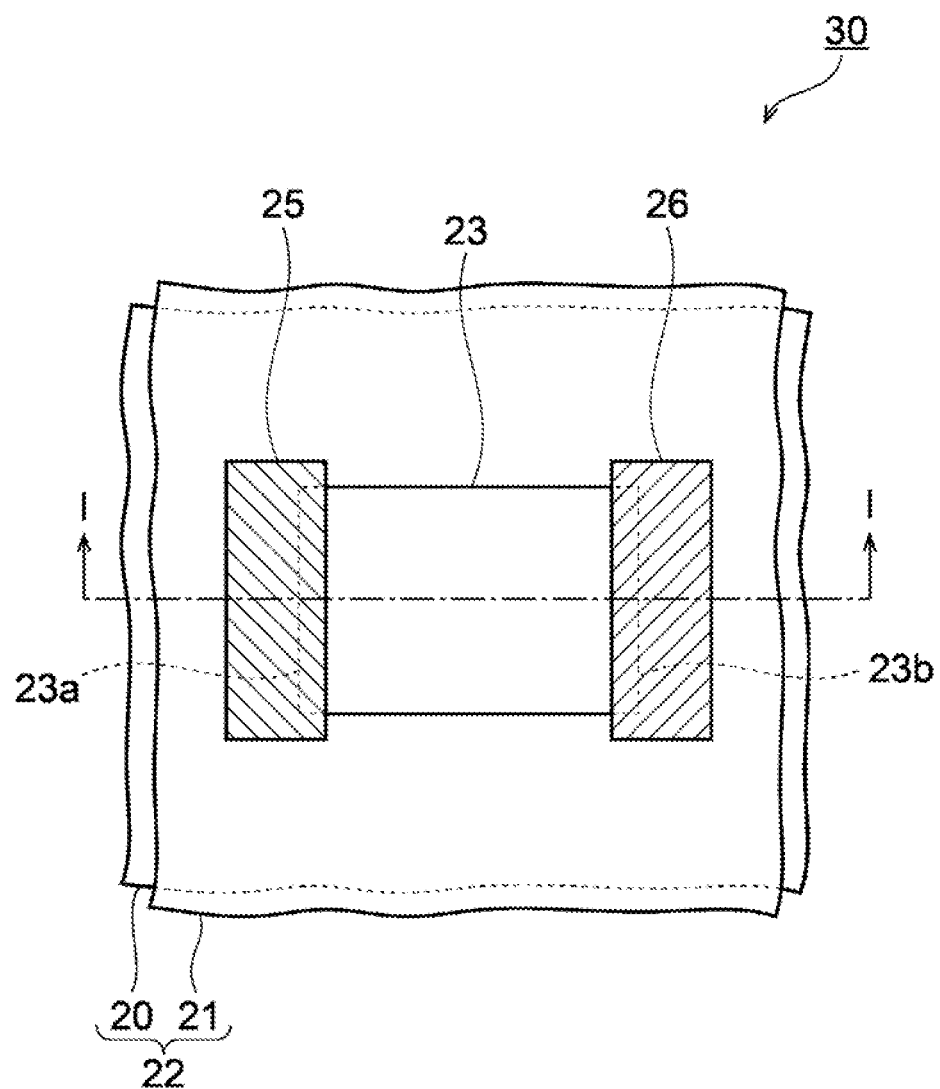
FIG. 11 is a plan view of the photo detection element in accordance with the first embodiment.

In the above-described structure, when a light C enters a surface 23z of the light-receiving layer 23, electrons in the graphene layers 11 are excited, and electrons having electron temperatures corresponding to the intensity of the light C are supplied from the graphene layers 11 to each of the electrodes 25 and 26. An electric potential difference corresponding to the intensity of the light C is generated between the electrodes 25 and 26 due to the difference in Seebeck coefficient between the electrodes 25 and 26, and the electric potential difference is output to the outside as an output voltage. Since the photo-thermoelectric effect of graphene of the graphene layers 11 is used as described above, it is not necessary to cool the photo detection element 30, and the applications of the photo detection element 30 are thus expanded. FIG. 11 is a plan view of the photo detection element 30, and FIG. 9B corresponds to the cross-sectional view taken along line I-I in FIG. 11. As illustrated in FIG. 11, the light-receiving layer 23 has a rectangular shape with a side of approximately 1 μm to 100 μm, and the electrodes 25 and 26 are respectively formed on the side surfaces 23a and 23b facing each other.

In the first embodiment described above, as illustrated in FIG. 9B, the graphene layers 11 of the light-receiving layer 23 are separated by the spacer layers 17. Thus, the graphene layers 11 are inhibited from being in contact with each other and thereby forming graphite. Accordingly, the photo-thermoelectric effect is sufficiently exerted in each of the graphene layers 11 without impairing the characteristics of the graphene layers 11 such as high electron mobility and wavelength-independent light absorptivity, and the sensitivity of the photo detection element 30 is therefore enhanced.

According to estimates by the inventors of the present application, when the number of the graphene layers 11 in the light-receiving layer 23 is 100, the light absorptivity of the light-receiving layer 23 is 95% or greater, which is approximately 50 times the sensitivity when only a single graphene layer 11 is formed.

In addition, since the spacer layer 17 is transparent to the light to be detected, the light C is prevented from being blocked by the spacer layer 17. Thus, the light C can reach the graphene layer 11 located deep in the light-receiving layer 23.

In particular, hexagonal boron nitride, which is the material of the spacer layer 17, is transparent in the infrared region, and has the property of maintaining the mobility of electrons of the graphene layer 11 high. Thus, the photo detection element 30 can be used as a highly sensitive infrared detecting element.

The material of the spacer layer 17 is not limited to hexagonal boron nitride as long as the material is an insulating material that is transparent to a light to be detected. For example, transition metal di-chalcogenide such as molybdenum disulfide ($MoS_2$), tungsten disulfide ($WS_2$), molybdenum diselenide ($MoSe_2$), or tin disulfide ($SnS_2$) does not have remarkable absorption in the infrared region, and thus, can be used as the material of the spacer layer 17. In addition, the spacer layer 17 may be formed of a semiconductor material having a sufficient insulation property so that electric short circuit between the electrodes 25 and 26 does not occur. Furthermore, the spacer layer 17 may be formed to a thickness greater than the thickness of a monoatomic layer as long as the translucency of the spacer layer 17 is not impaired.

In the first embodiment, the first side surface 23a of the light-receiving layer 23 is inclined with respect to the normal direction n of the substrate 22. Thus, the material of the first electrode 25 easily adheres onto the ends 11a of the graphene layers 11. As a result, the ends 11a are more reliably in contact with the first electrode 25. Therefore, the contact resistance between the light-receiving layer 23 and the first electrode 25 is reduced. In addition, since each graphene layer 11 is more easily in contact with the first electrode 25, as the number of the graphene layers 11 increases, the contact resistance between the light-receiving layer 23 and the first electrode 25 decreases. For the same reason, since the second side surface 23b is inclined with respect to the normal direction n, the contact resistance between the second electrode 26 and the light-receiving layer 23 is reduced.

Figure 12:
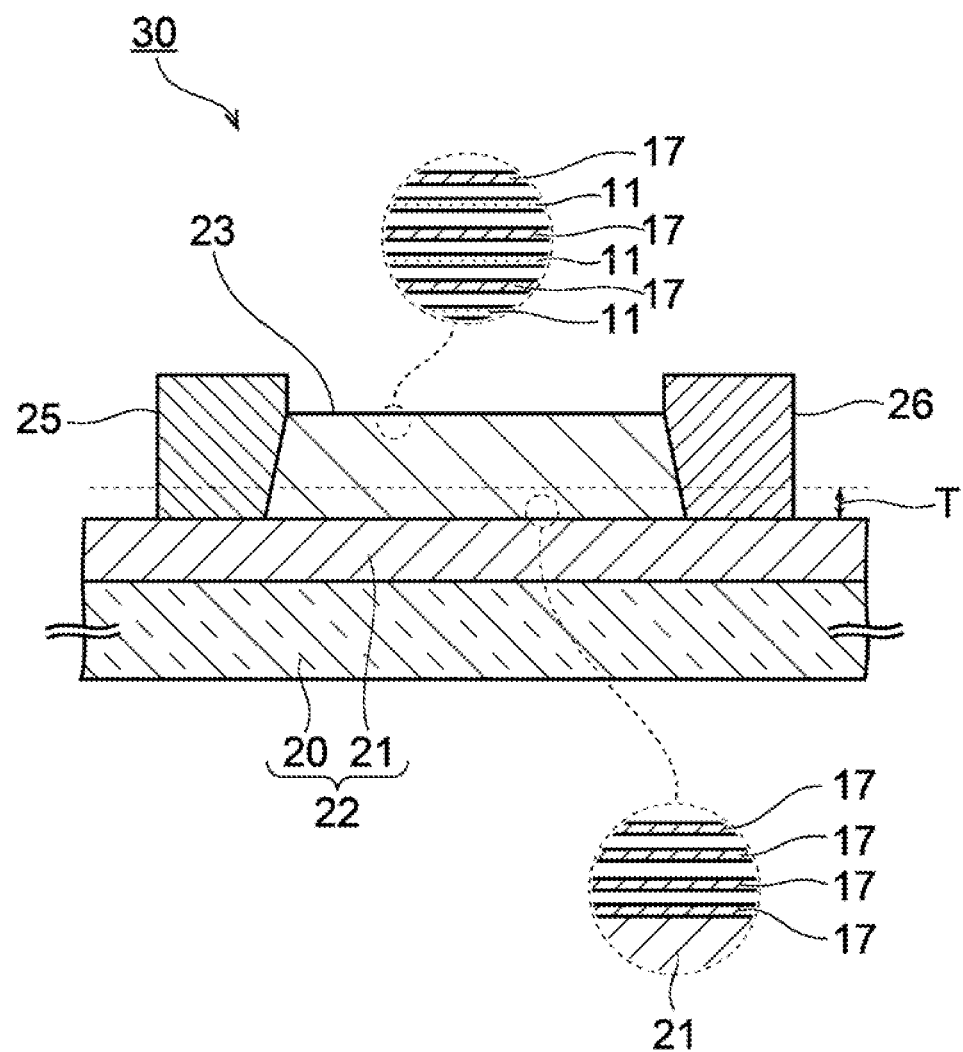
FIG. 12 is a cross-sectional view of a photo detection element in accordance with a variation of the first embodiment.

When the graphene layer 11 is directly formed on the substrate 22, the electrons transmitting through the graphene layer 11 may be scattered by the surface polar phonons of the silicon oxide layer 21, and the mobility of electrons may be thereby decreased. Thus, it is preferable that the lowermost layer of the light-receiving layer 23 is the spacer layer 17 to inhibit, by the spacer layer 17, the surface polar phonons of the silicon oxide layer 21 from affecting the graphene layers 11. In addition, to effectively remove the influence of the surface polar phonons of the silicon oxide layer 21, the light-receiving layer 23 having the following structure may be employed. FIG. 12 is a cross-sectional view of the photo detection element 30 in accordance with a variation of the first embodiment.

In this variation, only a plurality of the spacer layers 17 is stacked to a thickness T from the lowermost layer of the light-receiving layer 23 without interposing the graphene layer 11 between the vertically adjacent spacer layers 17. The number of the spacer layers 17 that are stacked is, for example, 10 or greater. This structure separates the graphene layer 11 a great distance away from the substrate 22, and therefore effectively inhibits the mobility of electrons in the graphene layer 11 from decreasing due to the surface polar phonons of the silicon oxide layer 21. In particular, since the silicon oxide layer 21 greatly decreases the mobility of electrons in the graphene layers 11 by the surface polar phonons thereof, it is preferable to stack only a plurality of the spacer layers 17 to inhibit the decrease in the electron mobility.

Second Embodiment

In a second embodiment, the contact resistances between the graphene layers 11 and the electrodes 25 and 26 are reduced in the following manner.

Figure 13A:
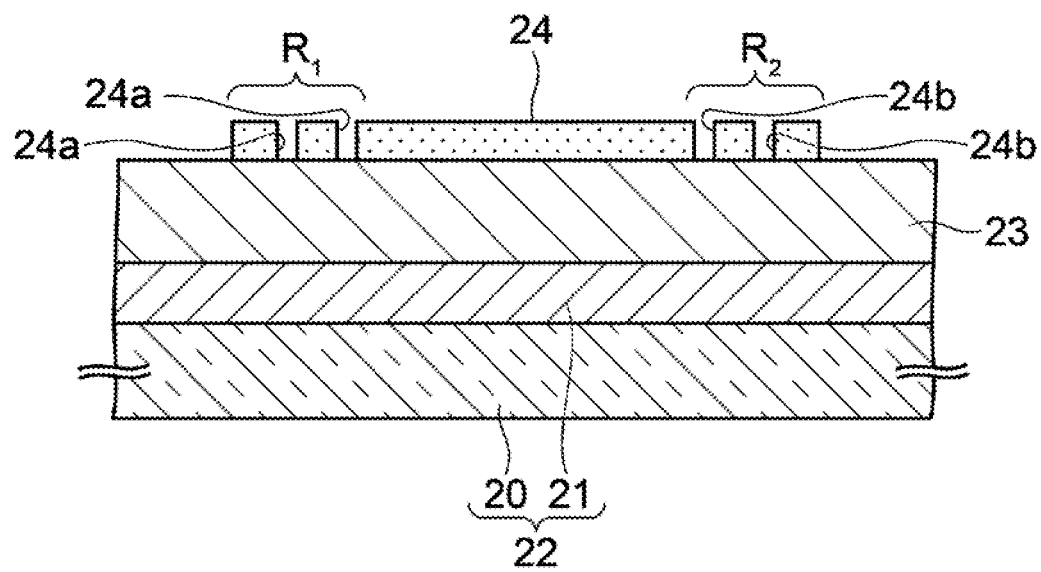
FIG. 13A and FIG. 13B are cross-sectional views (No. 1) of a photo detection element in accordance with a second embodiment in the process of production.

FIG. 13A through FIG. 15 are cross-sectional views of a photo detection element in accordance with the second embodiment in the process of production. In FIG. 13A through FIG. 15, the same reference numerals are used for the same elements as those described in the first embodiment, and the description thereof is omitted. First, the steps of FIG. 3A through FIG. 7B described in the first embodiment are conducted to obtain the structure in which the mask layer 24 is formed on the light-receiving layer 23 as illustrated in FIG. 13A. However, in the second embodiment, first openings 24a are formed in the mask layer 24 in a first region $R_1$ where an electrode is to be formed later, and second openings 24b are formed in the mask layer 24 in a second region $R_2$ where an electrode is to be formed later.

Figure 13B:
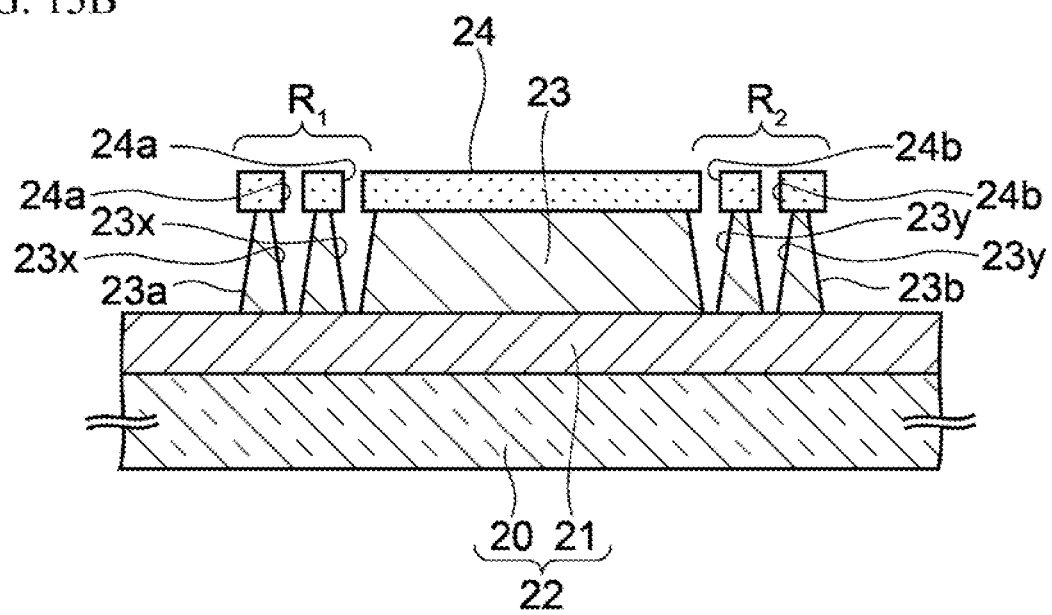
Figure 14A:
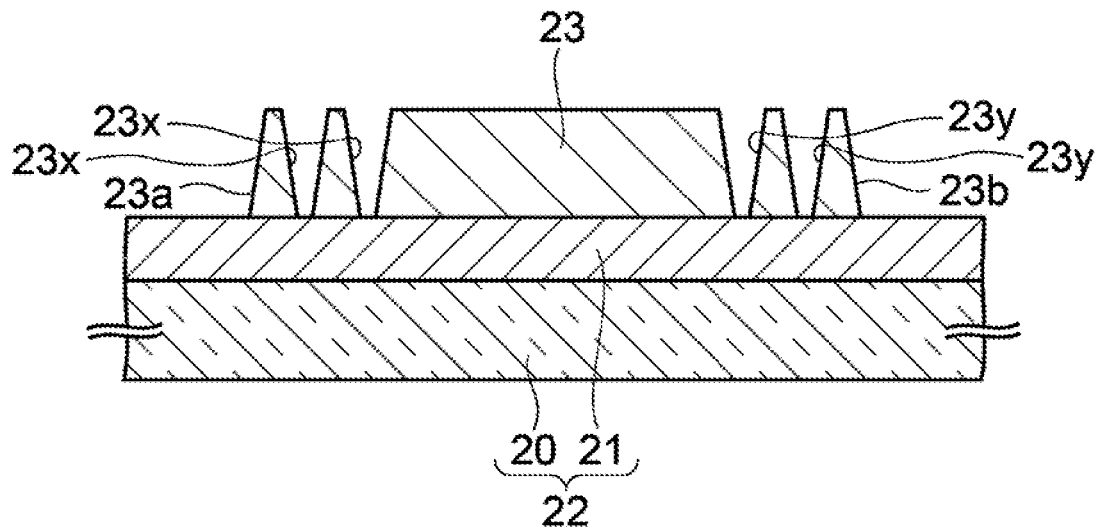
FIG. 14A and FIG. 14B are cross-sectional views (No. 2) of the photo detection element in accordance with the second embodiment in the process of production.

Then, as illustrated in FIG. 13B, the light-receiving layer 23 is isotropically etched by oxygen plasma through the openings 24a and 24b. Through this process, in the first region $R_1$, tapered first holes 23x and the first side surface 23a are formed in the light-receiving layer 23. In the second region $R_2$, tapered second holes 23y and the second side surface 23b are formed in the light-receiving layer 23. These holes 23x and 23y have diameters of, for example, approximately 0.02 μm to 2 μm. Thereafter, as illustrated in FIG. 14A, the mask layer 24 is removed.

Figure 14B:
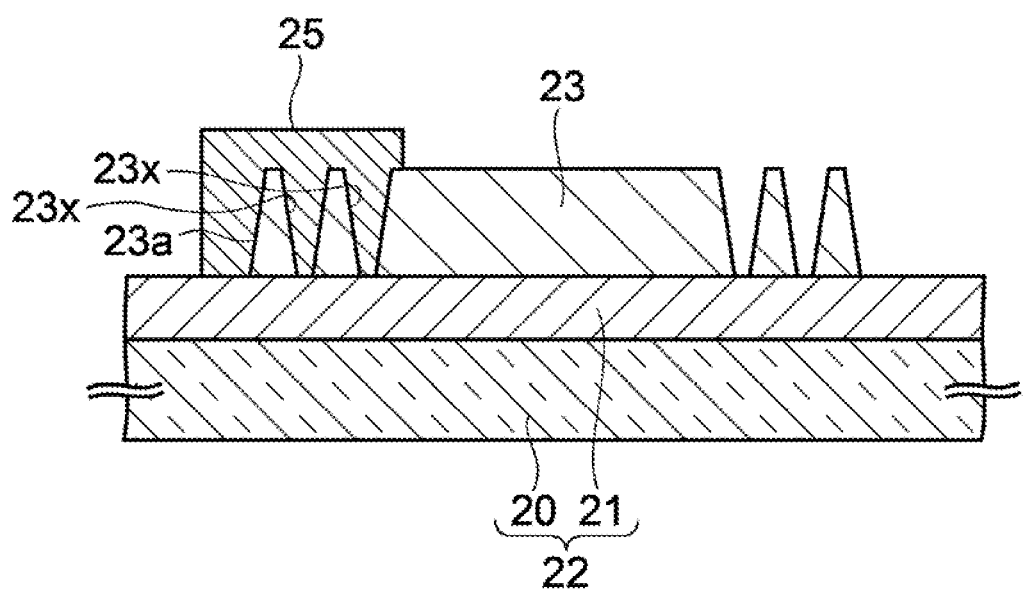

Then, as illustrated in FIG. 14B, a resist layer (not illustrated) having an opening to which the first side surface 23a and the first holes 23x are exposed is formed, and a titanium layer is then formed across the entire upper surface of the substrate 22 by evaporation. Thereafter, the resist layer is remove to leave the titanium layer, as the first electrode 25, in the first holes 23x and on the first side surface 23a and remove the unnecessary titanium layer.

Figure 15:
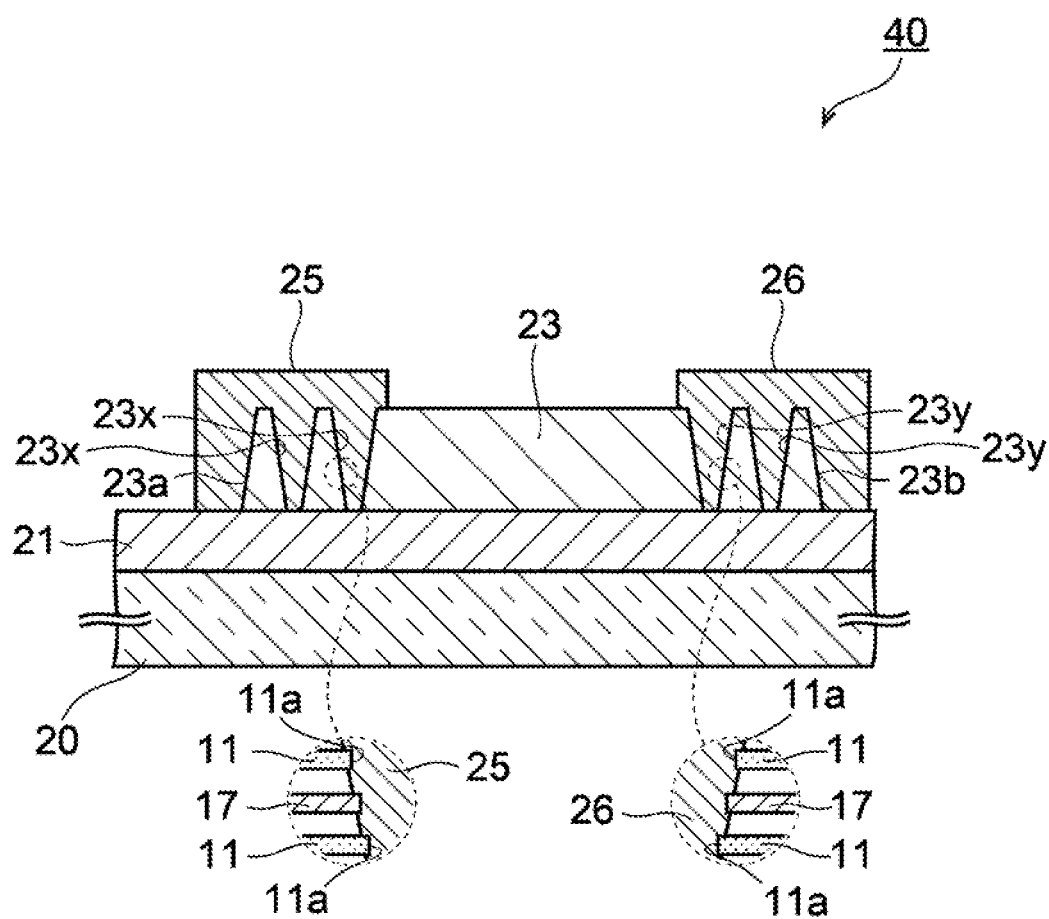
FIG. 15 is a cross-sectional view (No. 3) of the photo detection element in accordance with the second embodiment in the process of production.
Figure 16:
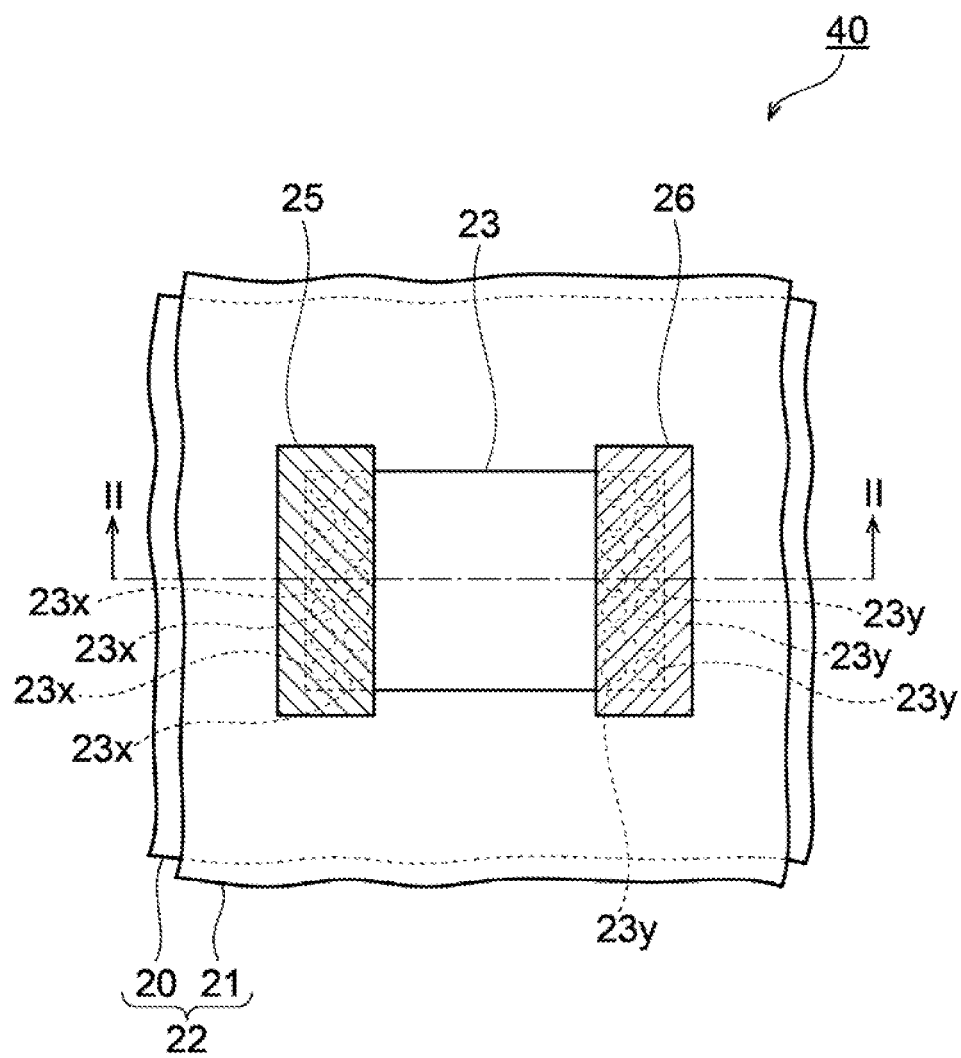
FIG. 16 is a plan view of the photo detection element in accordance with the second embodiment.

Then, as illustrated in FIG. 15, a resist layer (not illustrated) having an opening to which the second side surface 23b and the second holes 23y are exposed is formed. Thereafter, a platinum layer is formed across the entire upper surface of the substrate 22 by evaporation. Then, the resist layer is removed to leave the platinum layer, as the second electrode 26, in the second holes 23y and on the second side surface 23b and remove the unnecessary platinum layer. Through the above-described process, the fundamental structure of a photo detection element 40 in accordance with the second embodiment is completed. FIG. 16 is a plan view of the photo detection element 40, and FIG. 15 corresponds to the cross-sectional view taken along line 11-11 in FIG. 16. As illustrated in FIG. 16, the first holes 23x are arranged in a grid pattern in plan view, and the second holes 23y are arranged in a grid pattern in plan view.

In the second embodiment described above, the first holes 23x are formed in the light-receiving layer 23, and the first electrode 25 is formed also in the first holes 23x. Thus, not only on the first side surface 23a but also in the first holes 23x, the first electrode 25 is in contact with the ends 11a of the graphene layers 11, and thereby, the contact resistance between the first electrode 25 and the graphene layers 11 is reduced.

Since the first holes 23x are tapered, the material of the first electrode 25 easily adheres onto the ends 11a of the graphene layers 11. Thus, the contact resistance between the first electrode 25 and the graphene layers 11 is further reduced. Similarly, also in the second holes 23y, the contact resistance between the second electrode 26 and the graphene layers 11 is reduced.

Third Embodiment

In a third embodiment, a structure different from that of the second embodiment is employed to reduce the contact resistances between the graphene layers 11 and the electrodes 25 and 26.

Figure 17:
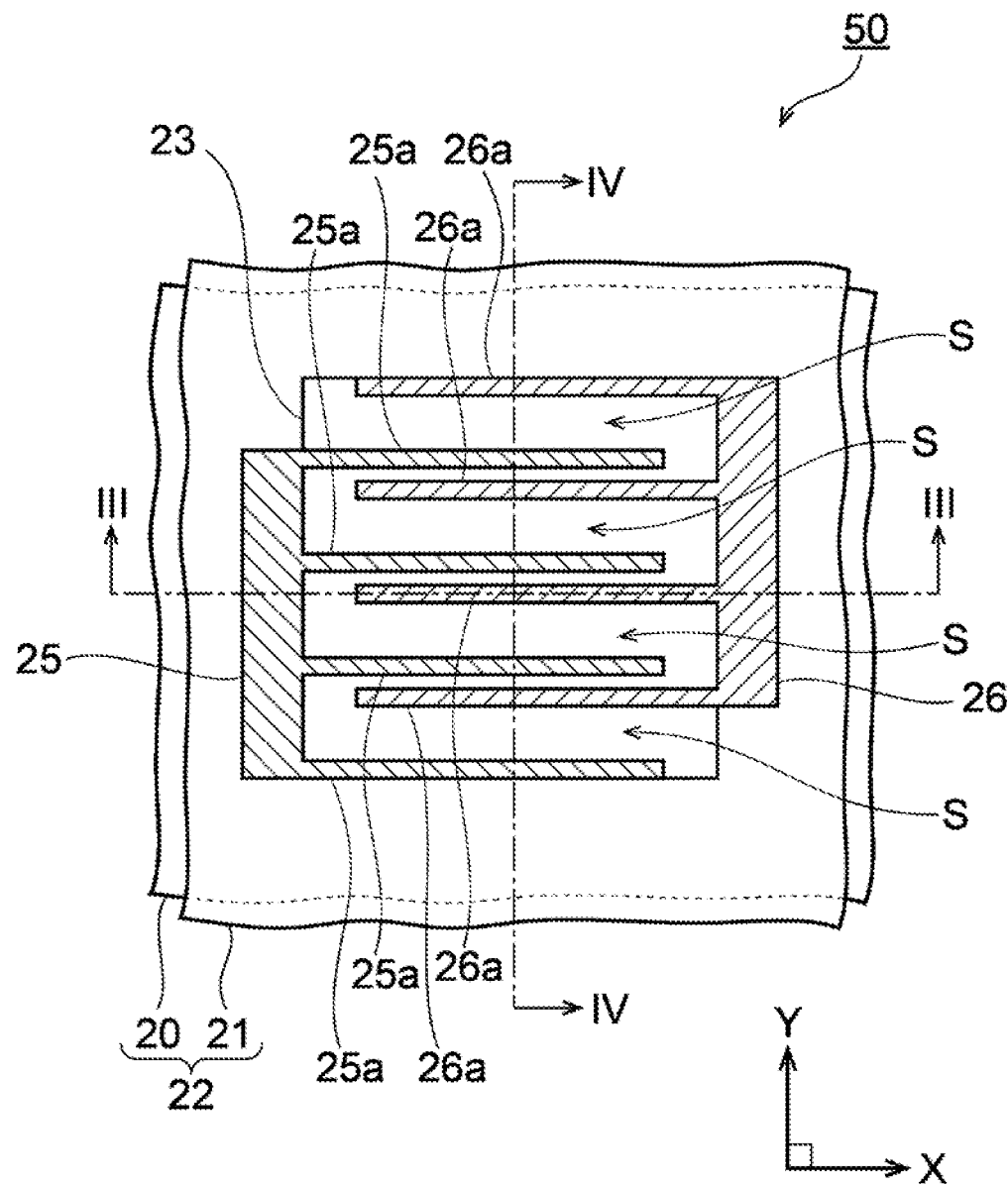
FIG. 17 is a plan view of a photo detection element in accordance with a third embodiment.

FIG. 17 is a plan view of a photo detection element 50 in accordance with the third embodiment. In FIG. 17, the same reference numerals are used for the same elements as those described in the first and second embodiments, and hereinafter, the description thereof is thus omitted.

Figure 18A:
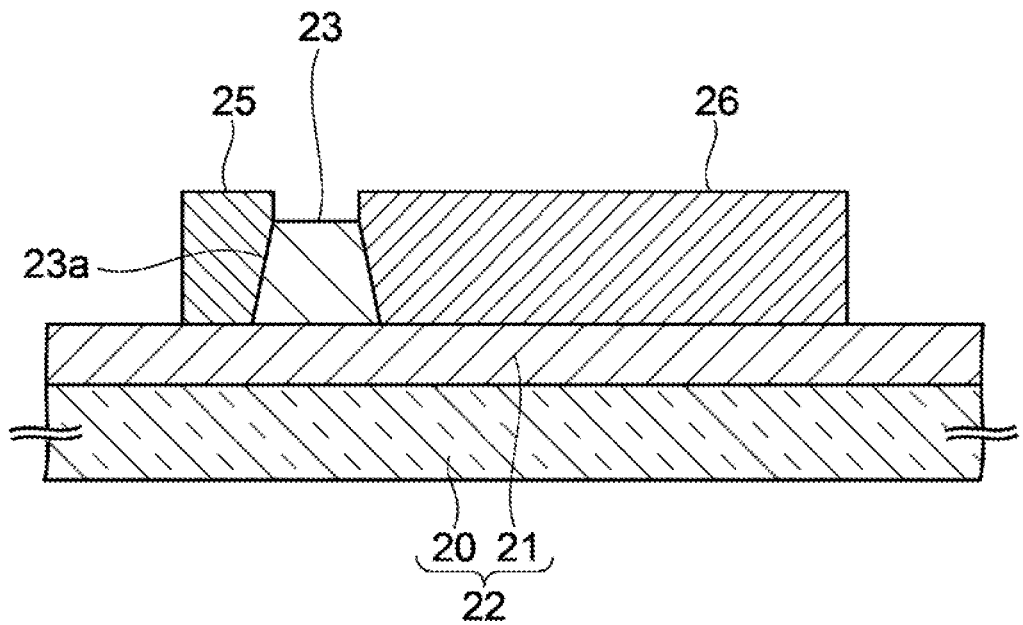
FIG. 18A is a cross-sectional view taken along line III-III in FIG. 17.
Figure 18B:
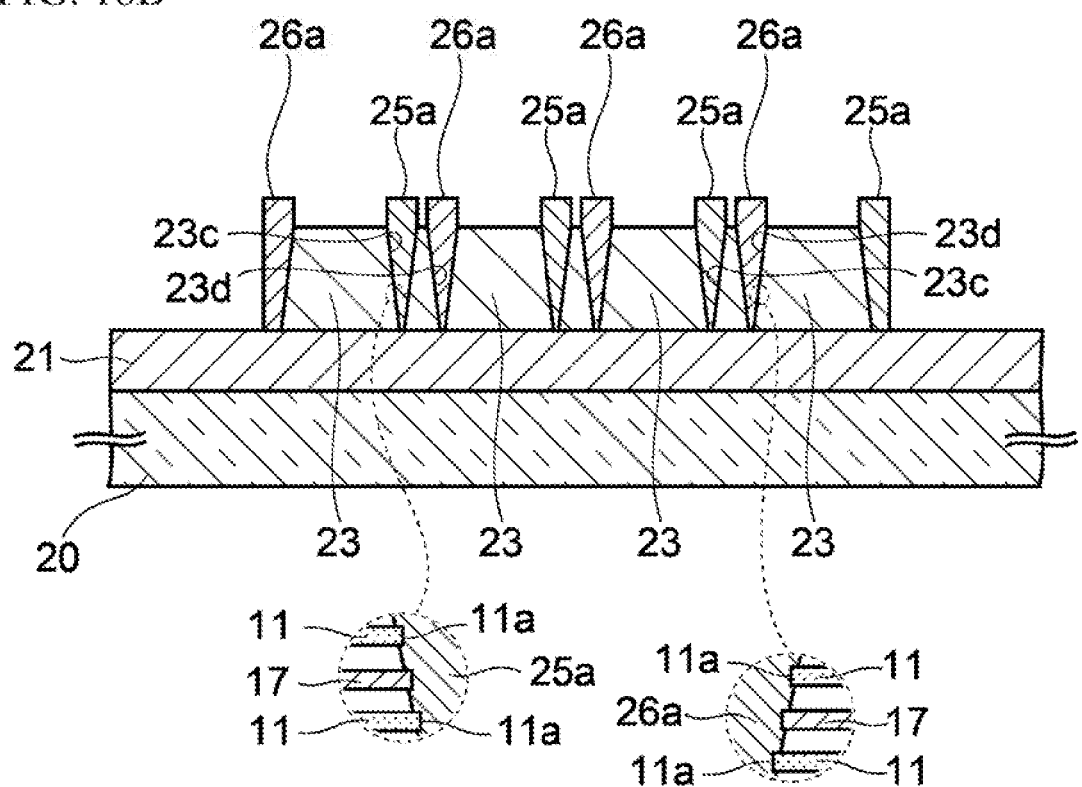
FIG. 18B is a cross-sectional view taken along line IV-IV in FIG. 17.

As illustrated in FIG. 17, the first electrode 25 in the third embodiment is comb-shaped in plan view, and has first teeth 25a extending in a first direction X. Similarly, the second electrode 26 is comb-shaped in plan view, and has second teeth 26a extending in the first direction X. The lengths and the widths of these teeth 25a and 26a are not particularly limited. For example, the teeth 25a and 26a may be formed to have lengths of approximately 1 μm to 100 μm in the first direction X, and the widths of the teeth 25a and 26a may be approximately 0.02 μm to 5 μm. The first teeth 25a are arranged at intervals in a second direction Y intersecting with the first direction X, and the second teeth 26a are arranged at intervals in the second direction Y. The interval between the adjacent first teeth 25a in the second direction Y is, for example, approximately 1 μm to 20 μm. The same applies to the second teeth 26a. FIG. 18A is a cross-sectional view taken along line III-III in FIG. 17, and FIG. 18B is a cross-sectional view taken along line IV-IV in FIG. 17. As illustrated in FIG. 18A, the first electrode 25 is formed on and beside the first side surface 23a of the light-receiving layer 23 as in the first embodiment.

As illustrated in FIG. 188, first grooves 23c and second grooves 23d are formed in the light-receiving layer 23. The grooves 23c and 23d are formed by isotropically etching parts, which are not covered with the mask layer 24, of the light-receiving layer 23 as in the step of FIG. 13B in the second embodiment. The first teeth 25a are embedded in the first grooves 23c, and the second teeth 26a are embedded in the second grooves 23d.

This structure causes the first teeth 25a to be in contact with the ends 11a of the graphene layers 11 in the first grooves 23c, and the contact resistance between the first electrode 25 and the graphene layers 11 is reduced compared with the case where no first groove 23c is provided. Similarly, formation of the second teeth 26a in the second grooves 23d also reduces the contact resistance between the second electrode 26 and the graphene layers 11.

In addition, since the electrodes 25 and 26 are comb-shaped as illustrated in FIG. 17, the space S where the light-receiving layer 23 receives a light is secured between the teeth 25a and 26a. Therefore, decrease in the light-receiving area of the light-receiving layer 23 is reduced.

Fourth Embodiment

In a fourth embodiment, the output voltage output from the photo detection element is increased in the following manner.

Figure 19:
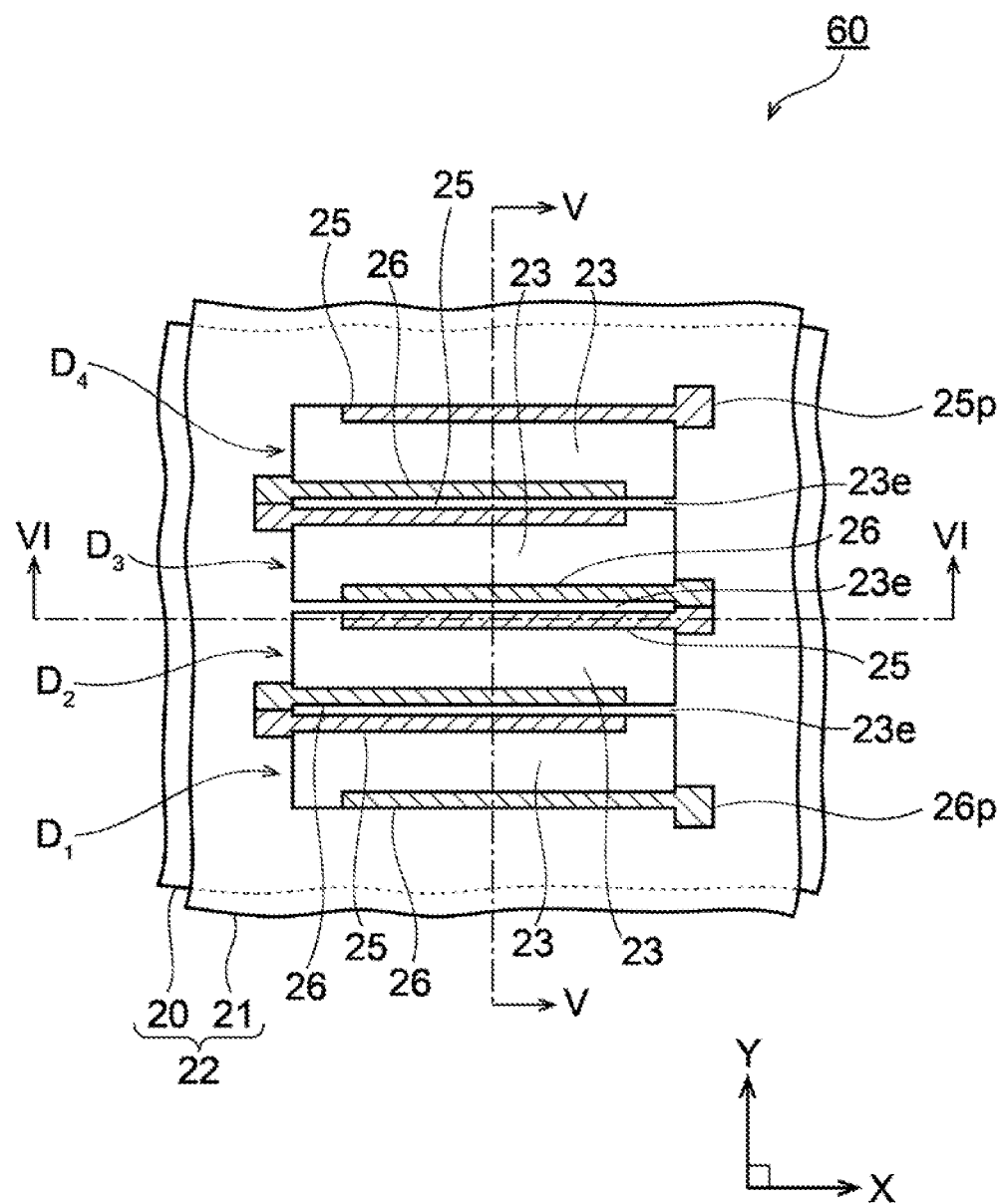
FIG. 19 is a plan view of a photo detection element in accordance with a fourth embodiment.

FIG. 19 is a plan view of a photo detection element 60 in accordance with the fourth embodiment. In FIG. 19, the same reference numerals are used for the same elements as those described in the first through third embodiments, and the description thereof is omitted.

As illustrated in FIG. 19, in the fourth embodiment, element separation grooves 23e extending in the first direction X are formed in the light-receiving layer 23, and the light-receiving layer 23 is separated into first through fourth light-receiving sections $D_1$ through $D_4$ by the element separation grooves 23e. The light-receiving sections $D_1$ through $D_4$ have rectangular shapes in plan view, and are arranged at intervals in the second direction Y intersecting with the first direction X. The width of the element separation groove 23e is approximately 0.02 μm to 5 μm.

Figure 20A:
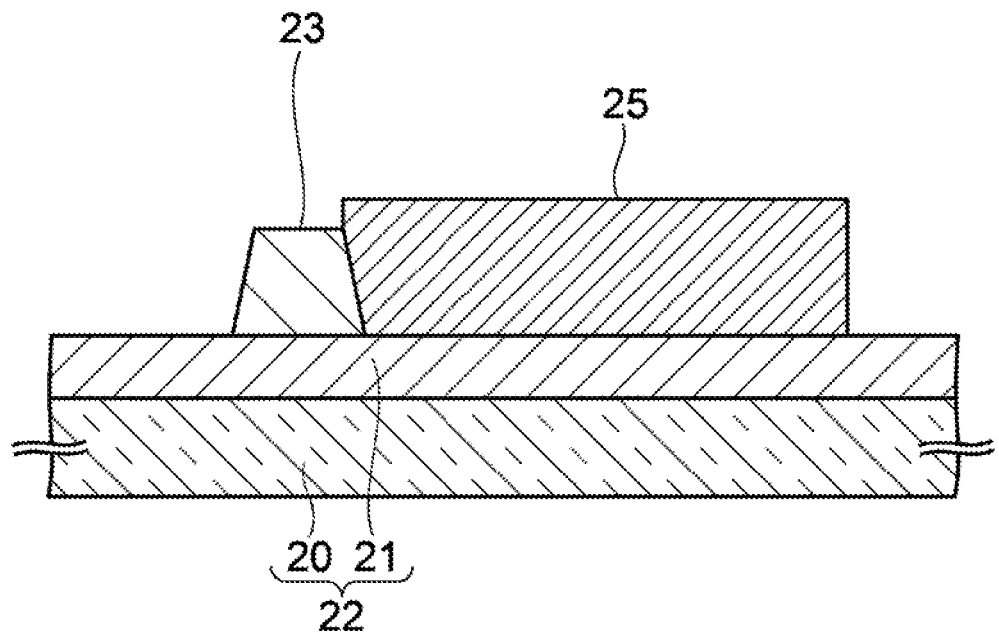
FIG. 20A is a cross-sectional view taken along line VI-VI in FIG. 19.
Figure 20B:
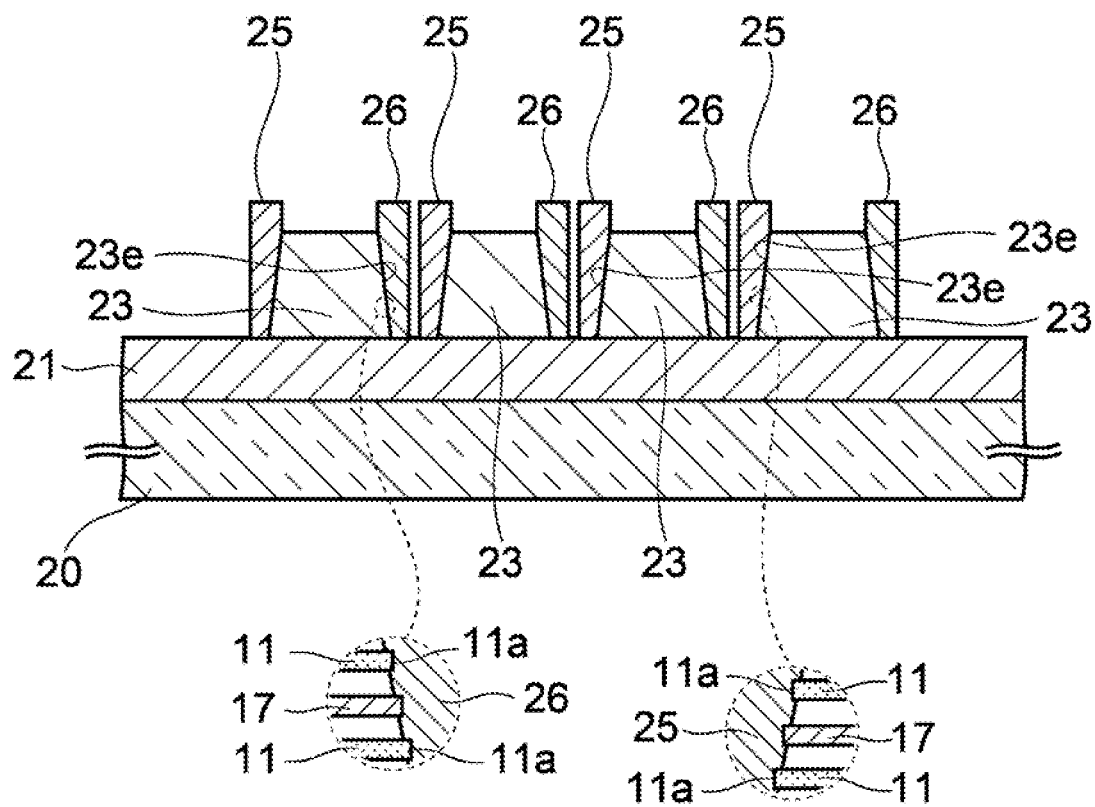
FIG. 20B is a cross-sectional view taken along line V-V in FIG. 19.

Then, the first electrode 25 and the second electrode 26 are provided to each of the light-receiving sections $D_1$ through $D_4$, and the first electrode 25 of one of the adjacent light-receiving sections and the second electrode 26 of the other of the adjacent light-receiving sections are electrically connected. An output pad 25p for extracting the output voltage of the light-receiving layer 23 is provided to the first electrode 25 at the one outermost end, and an output pad 26p for extracting the output voltage of the light-receiving layer 23 is provided to the second electrode 26 at the other outermost end. In the structure described above, the light-receiving sections $D_1$ through $D_4$ are connected in series. Thus, the output voltage output from the photo detection element 60 is increased. FIG. 20A is a cross-sectional view taken along line VI-VI in FIG. 19, and FIG. 20B is a cross-sectional view taken along line V-V in in FIG. 19. As illustrated in FIG. 20A, in the cross-section taken along line VI-VI, the second electrode 26 is not present but the first electrode 25 is present.

In addition, as illustrated in FIG. 20B, the electrodes 25 and 26 are formed on the side surfaces of the element separation groove 23e. The element separation grooves 23e can be formed by isotropically etching parts, which are not covered with the mask layer 24, of the light-receiving layer 23 as in the step of FIG. 13B in the second embodiment. The structure described above allows the electrodes 25 and 26 to be connected to the ends 11a of the graphene layers 11 in the element separation grooves 23e.

Fifth Embodiment

Figure 21:
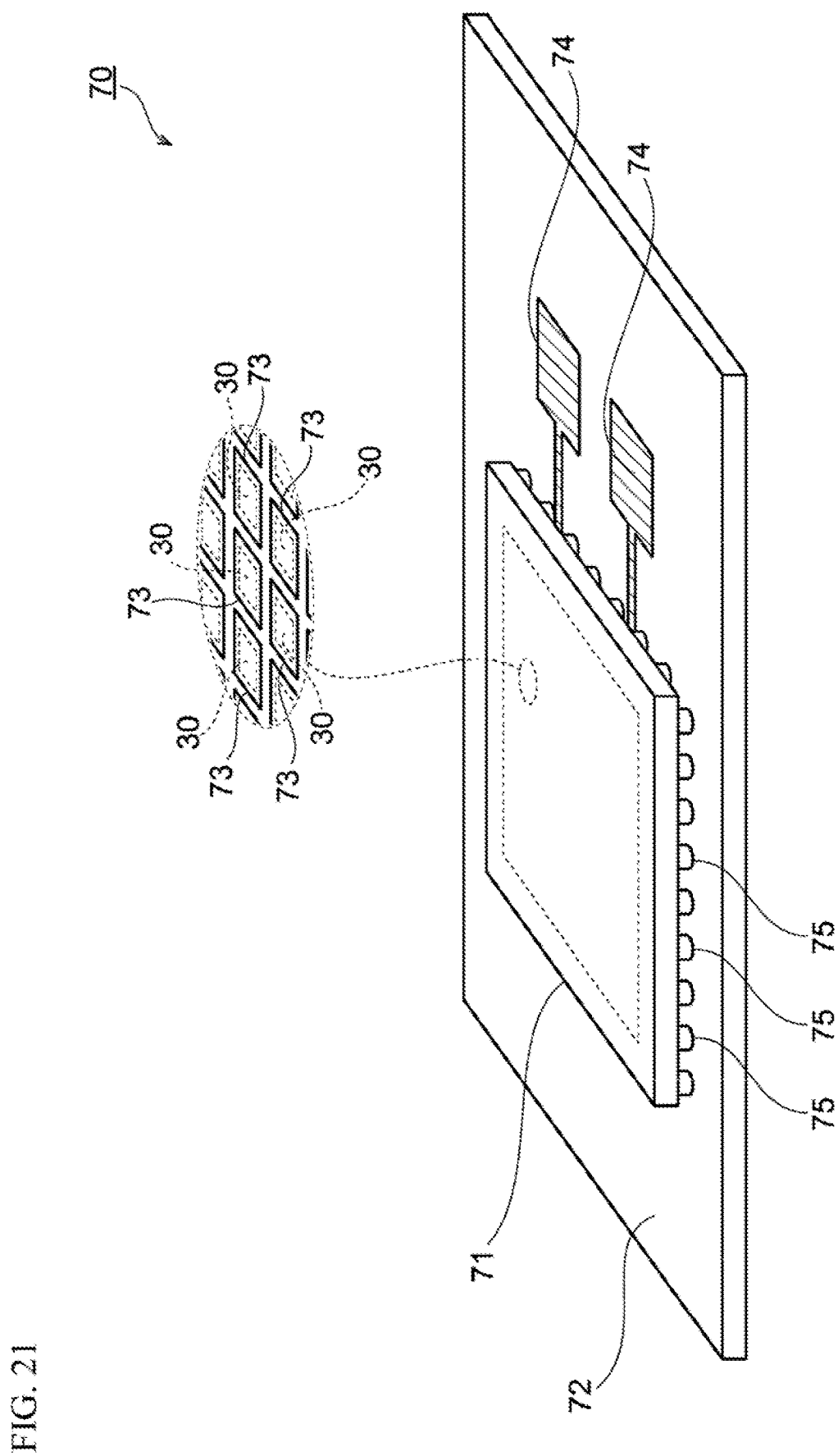
FIG. 21 is a perspective view of an optical sensor in accordance with a fifth embodiment.

In a fifth embodiment, an optical sensor including the photo detection element described in the first embodiment will be described. FIG. 21 is a perspective view of an optical sensor in accordance with the fifth embodiment. In FIG. 21, the same reference numerals are used for the same elements as those described in the first through fourth embodiments, and the description thereof is omitted. An optical sensor 70 is an image sensor for obtaining an image, and includes an imaging element 71 and a drive element 72 driving the imaging element 71.

The imaging element 71 includes pixels 73 formed at intervals in a plane. Each pixel 73 includes the photo detection element 30 of the first embodiment, and outputs the output voltage corresponding to an incident light. Instead of the photo detection element 30, the photo detection element in accordance with any one of the second through fourth embodiments may be used.

Figure 22:
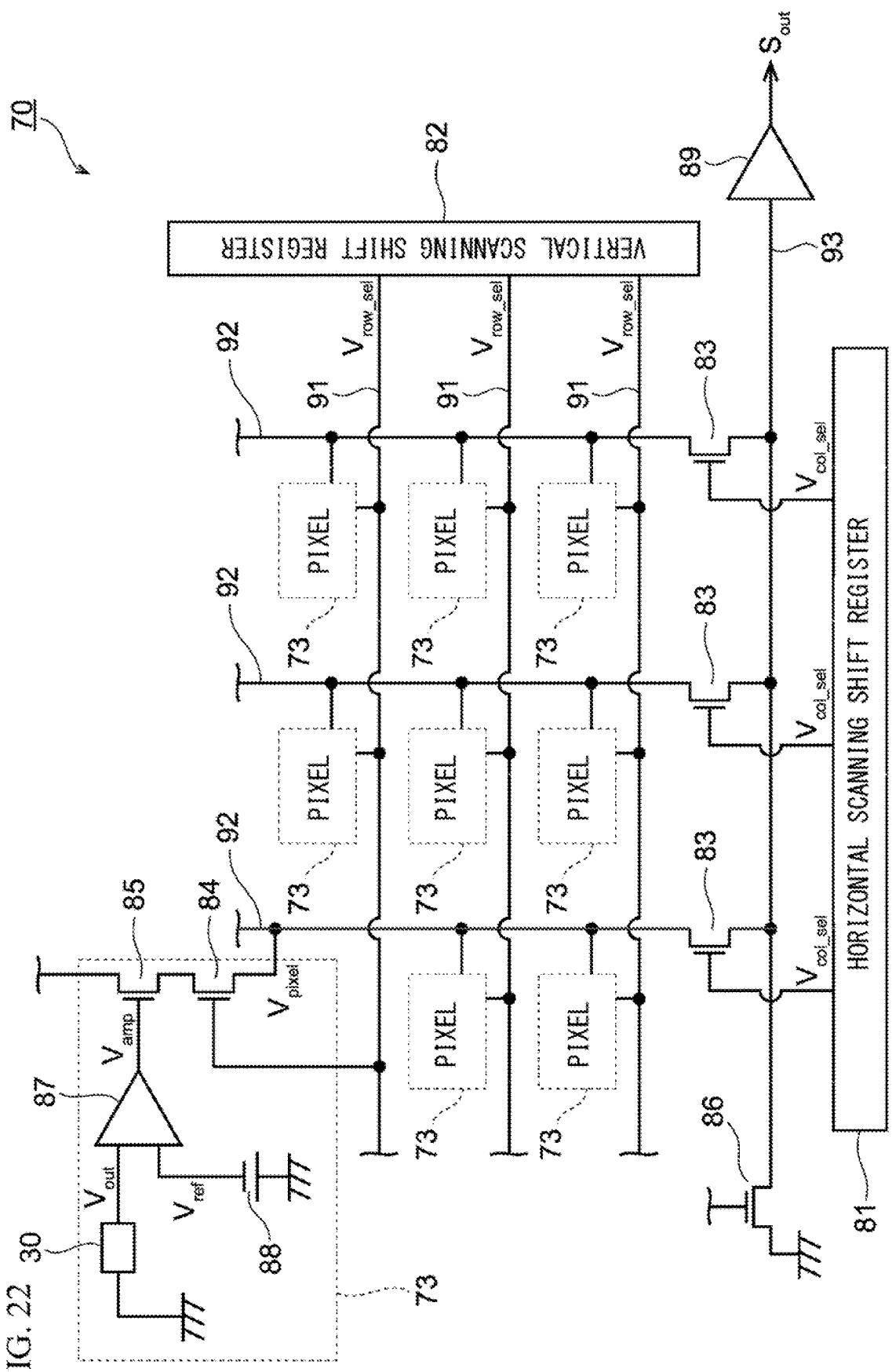
FIG. 22 is an equivalent circuit diagram of an optical sensor in accordance with the fifth embodiment.

The drive element 72 includes a silicon substrate on which transistors having complementary metal oxide semiconductor (CMOS) structures are formed. These transistors include selection transistors for selecting a certain pixel 73 including the photo detection element 30, and a transistor for an amplifier circuit such as an amplifier that amplifies the output voltage of the pixel 73. The drive element 72 includes input and output pads 74. A drive voltage for driving the imaging element 71 is input from the pad 74. The output voltage amplified by the amplifier circuit is output from the pad 74. The imaging element 71 and the drive element 72 are mechanically electrically connected by bumps 75. FIG. 22 is an equivalent circuit diagram of the optical sensor 70.

As illustrated in FIG. 22, the optical sensor 70 includes a horizontal scanning shift register 81, a vertical scanning shift register 82, column selection transistors 83, a source follower current setting transistor 86, and an output amplifier 89.

The horizontal scanning shift register 81 applies a column selection voltage $V_{col\_sel}$ to the gate of one of the column selection transistors 83 to cause the column selection transistor 83 to be in the on state.

The vertical scanning shift register 82 applies a row selection voltage $V_{row\_sel}$ to one of address lines 91. This causes row selection transistors 84 of the pixels 73 connected to the address lines 91 to which the row selection voltage $V_{row\_sel}$ is applied to be in the on state. The pixel 73 includes the photo detection element 30, the row selection transistor 84, an amplifier transistor 85, an input amplifier 87, and a power source 88.

When a light enters the photo detection element 30, an output voltage $V_{out}$ corresponding to the intensity of the light is output from the photo detection element 30 to the input amplifier 87. The voltage of the power source 88 is input to the input amplifier 87 as a reference voltage $V_{ref}$, and an amplified voltage $V_{amp}$ obtained by amplifying a voltage difference between the reference voltage $V_{ref}$ and the output voltage $V_{out}$ is output from the input amplifier 87.

The value of the reference voltage $V_{ref}$ is not particularly limited. For example, the value of the reference voltage $V_{ref}$ is appropriately adjusted according to the average output voltage of the photo detection element so that the amplified voltage $V_{amp}$ is suitable for the circuits in latter stages.

The amplified voltage $V_{amp}$ is applied to the gate of the amplifier transistor 85. The amplifier transistor 85 functions as a source follower amplifier, and the voltage corresponding to the amplified voltage $V_{amp}$ is output to the source of the amplifier transistor 85.

The row selection transistor 84 is connected to the source of the amplifier transistor 85, and when the row selection transistor 84 is in the on state, a pixel voltage $V_{pixel}$ with a magnitude corresponding to the amplified voltage $V_{amp}$ is output to a vertical bus line 92.

As described above, in the optical sensor 70, the pixel voltage $V_{pixel}$ is extracted from one pixel 73 selected by the horizontal scanning shift register 81 and the vertical scanning shift register 82.

Then, the pixel voltage $V_{pixel}$ is output to a horizontal bus line 93 in sequence by switching the pixel 73 to be selected with time. The amount of current through the horizontal bus line 93 is set by the source follower current setting transistor 86. The pixel voltage $V_{pixel}$ is input to the output amplifier 89 through the horizontal bus line 93. The output amplifier 89 amplifies each pixel voltage $V_{pixel}$, and outputs an image signal with an analog value to the outside.

Figure 23:
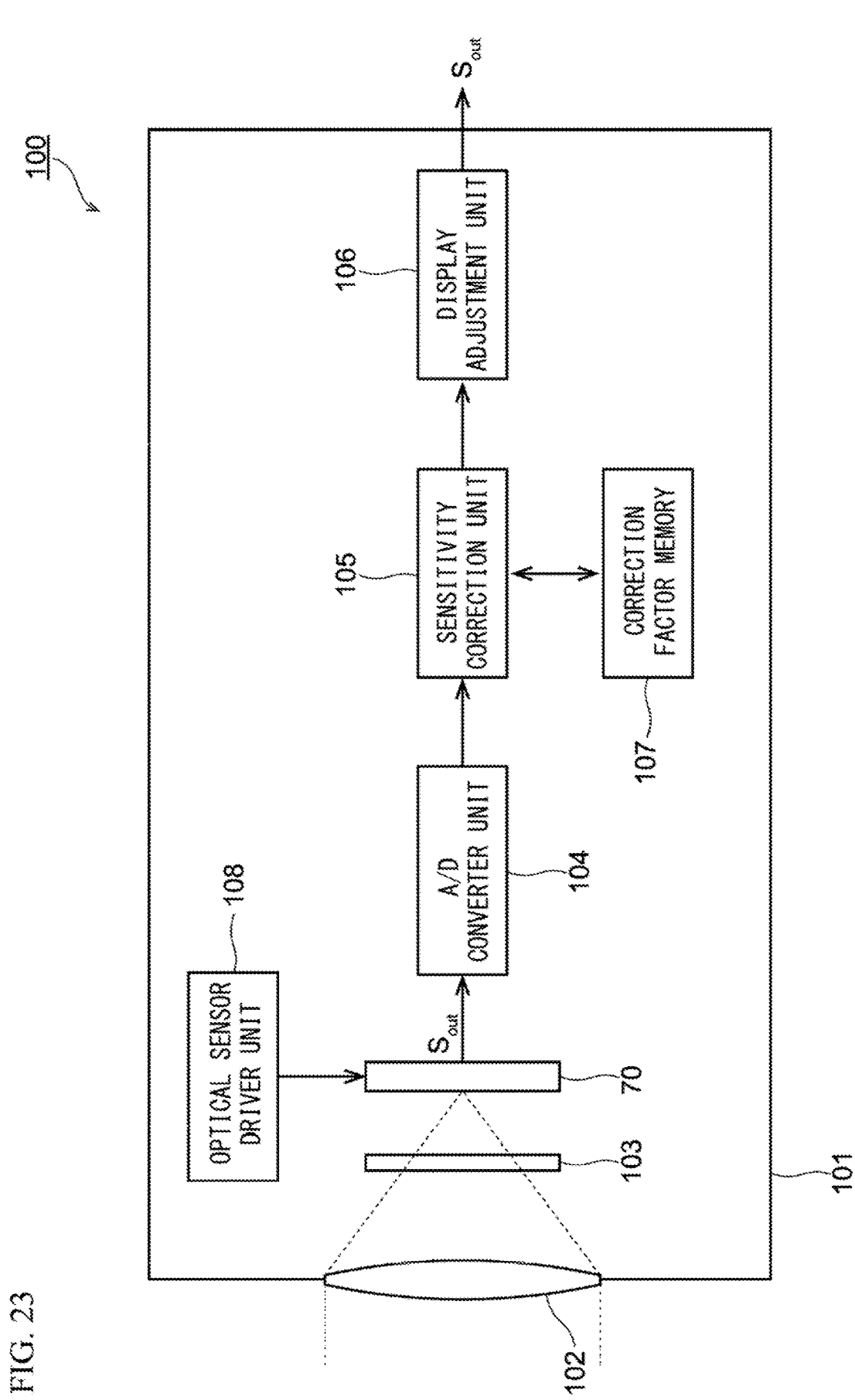
FIG. 23 is a block diagram of an imaging device in accordance with the fifth embodiment.

The optical sensor 70 described above allows an image to be obtained even when a light is weak because the sensitivity of the photo detection element 30 is increased by alternately stacking the graphene layers 11 and the spacer layers 17 as described in the first embodiment. Next, an imaging device including the optical sensor 70 will be described. FIG. 23 is a block diagram of an imaging device 100 in accordance with the present embodiment.

As illustrated in FIG. 23, the imaging device 100 includes a chassis 101 housing the optical sensor 70. An imaging lens 102, a filter 103, an A/D converter unit 104, a sensitivity correction unit 105, a display adjustment unit 106, a correction factor memory 107, and an optical sensor driver unit 108 are provided in the chassis 101. In this example, the photo detection elements 30 of the optical sensor 70 are positioned in the focal point of the imaging lens 102. The output from the imaging element 71 is extracted by the drive element 72 described above while the optical sensor 70 is controlled by the optical sensor driver unit 108.

The filter 103 is an infrared transmitting filter that allows infrared lights with a wavelength of, for example, 1000 nm or greater to pass therethrough, and is located between the imaging lens 102 and the optical sensor 70. The filter 103 causes the optical sensor 70 to obtain an infrared image. The A/D converter unit 104 converts an image signal $S_{out}$ output from the optical sensor 70 into a digital signal, and outputs the digital signal to the sensitivity correction unit 105.

The sensitivity correction unit 105 is a circuit that corrects the image signal $S_{out}$ in consideration of variation in the sensitivities of the pixels 73. In this example, the correction factor for correcting the sensitivity of each pixel 73 is stored in the correction factor memory 107 in advance. The sensitivity correction unit 105 refers to the correction factor memory 107 to correct the image signal $S_{out}$.

The corrected image signal $S_{out}$ is input to the display adjustment unit 106. The display adjustment unit 106 is a circuit that adjusts the gain and offset of the image signal $S_{out}$ to optimize the contrast of the image, and the final image signal $S_{out}$ after adjustment is output to the outside. The imaging device described above can obtain an infrared image even when infrared lights emitted from the imaging object is weak because the sensitivity of the photo detection element 30 in the optical sensor 70 is increased as described above.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A photo detection element comprising:
a substrate;
a light-receiving layer formed over the substrate, the light-receiving layer including graphene layers and spacer layers that are alternately stacked, light passing through each of the spacer layers, the spacer layers being made of insulating material, the light-receiving layer including a first side surface and a second side surface;
a first electrode that is formed over the first side surface and in contact with all of the graphene layers of the light-receiving layer; and
a second electrode that is formed over the second side surface and in contact with all of the graphene layers of the light-receiving layer, a material of the second electrode being different from a material of the first electrode,
the first side surface is inclined with respect to a normal direction of the substrate, the second side surface is inclined with respect to the normal direction.

2. The photo detection element according to claim 1, wherein a material of the spacer layer is hexagonal boron nitride.

3. The photo detection element according to claim 1, wherein a material of the spacer layer is transition metal di-chalcogenide.

4. The photo detection element according to claim 1, wherein
the light-receiving layer includes a first region and a second region,
first holes are formed in the light-receiving layer in the first region,
second holes are formed in the light-receiving layer in the second region,
the first electrode is formed in the first holes, and
the second electrode is formed in the second holes.

5. The photo detection element according to claim 4, wherein each of the first holes has a tapered shape in cross-sectional view, and each of the second holes has a tapered shape in cross-sectional view.

6. The photo detection element according to claim 1, wherein
first grooves and second grooves are formed in the light-receiving layer,
the first electrode is comb-shaped, the first electrode including first teeth embedded in the first grooves, and
the second electrode is comb-shaped, the second electrode including second teeth embedded in the second grooves.

7. The photo detection element according to claim 1, wherein
the light-receiving layer is separated into a first light receiving section and a second light receiving section by an element separation groove,
the first electrode and the second electrode are provided to each of the first light receiving section and the second light receiving section, and the first electrode of the first light receiving section is electrically connected to the second electrode of the second light receiving section.

8. The photo detection element according to claim 1, wherein a lowermost layer of the light-receiving layer is the spacer layer.

9. The photo detection element according to claim 1, wherein an uppermost layer of the light-receiving layer is the spacer layer.

10. The photo detection element according to claim 1, wherein a plurality of the spacer layers is stacked in a portion of the light-receiving layer, the portion ranging from a lowermost layer of the light-receiving layer to an intermediate depth of the light-receiving layer, the graphene layers not existing between the adjacent spacer layers in the portion.

11. The photo detection element according to claim 1, wherein the light is an infrared light.

12. A method of manufacturing a photo detection element, comprising:
forming a light-receiving layer by alternately stacking graphene layers and spacer layers over a substrate, light passing through each of the spacer layers, the spacer layers being made of insulating material, the light-receiving layer including a first side surface and a second side surface;
forming a first electrode over the first side surface, the first electrode being in contact with all of the graphene layers of the light-receiving layer; and
forming a second electrode over the second side surface, the second electrode being in contact with the all of the graphene layers of light-receiving layer, a material of the second electrode being different from a material of the first electrode,
the forming of the light-receiving layer includes alternately repeating transferring the graphene layer formed over a first supporting layer to the substrate and transferring the spacer layer formed over a second supporting layer to the substrate,
the transferring of the spacer layer formed over the second supporting layer to the substrate includes heating the substrate.

13. The method according to claim 10, further comprising:
forming the graphene layer over a catalytic metal layer;
forming the first supporting layer over the graphene layer;
removing the catalytic metal layer by dissolving the catalytic metal layer after the forming of the first supporting layer; and
removing the first supporting layer by dissolving the first supporting layer after the transferring of the graphene layers to the substrate.

14. The method according to claim 12, further comprising:
forming the spacer layer over a catalytic metal layer;
forming the second supporting layer over the spacer layer;
removing the catalytic metal layer by dissolving the catalytic metal layer after the forming of the second supporting layer; and
removing the second supporting layer by dissolving the second supporting layer after the transferring of the spacer layer to the substrate.

15. The method according to claim 12, wherein the light is an infrared light.

16. An optical sensor comprising:
pixels formed at intervals in a plane, each of the pixels outputting an output voltage corresponding to an intensity of an incident light; and
an amplifier circuit configured to amplify the output voltage, wherein
the pixel includes:
   a substrate;
   a light-receiving layer formed over the substrate, the light-receiving layer including graphene layers and spacer layers that are alternately stacked, light passing through each of the spacer layers, the spacer layers being made of insulating material, the light-receiving layer including a first side surface and a second side surface;
   a first electrode that is formed over the first side surface and in contact with all of the graphene layers of the light-receiving layer; and
   a second electrode that is formed over the second side surface and in contact with all of the graphene layers of the light-receiving layer, a material of the second electrode being different from a material of the first electrode,
the first side surface is inclined with respect to a normal direction of the substrate, the second side surface is inclined with respect to the normal direction.

17. The optical sensor according to claim 16, wherein the light is an infrared light.

* * * * *